United States Patent
Barrenscheen et al.

(10) Patent No.: US 10,855,183 B1
(45) Date of Patent: Dec. 1, 2020

(54) METHOD AND DEVICE TO OPERATE A POWER SWITCH IN MULTIPLE MODES

(71) Applicant: Infineon Technologies AG, Neubiberg (DE)

(72) Inventors: Jens Barrenscheen, Munich (DE); Benno Koeppl, Markt Indersdorf (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 16/521,113

(22) Filed: Jul. 24, 2019

(51) Int. Cl.
  *H02M 3/158* (2006.01)
  *H02M 7/797* (2006.01)
  *H02M 5/293* (2006.01)
  G05F 1/573 (2006.01)
  H03K 17/082 (2006.01)

(52) U.S. Cl.
  CPC ......... *H02M 3/1582* (2013.01); *H02M 5/293* (2013.01); *H02M 7/797* (2013.01); *G05F 1/573* (2013.01); *H02M 2005/2935* (2013.01); *H03K 17/0822* (2013.01); *Y02B 70/1466* (2013.01)

(58) Field of Classification Search
  CPC ...... H02M 3/156; H02M 3/157; H02M 3/158; H02M 3/1582; H02M 3/1588; H02M 5/293; H02M 7/797; H02M 2001/007; H02M 2005/2935; Y02B 70/1466
  USPC .................................................. 323/271, 282
  See application file for complete search history.

(56) References Cited

U.S. PATENT DOCUMENTS

| | | | | |
|---|---|---|---|---|
| 7,030,591 B2* | 4/2006 | Stellberger | ............ | H02J 7/0029 320/134 |
| 7,839,130 B2* | 11/2010 | Shimizu | .................. | H02M 1/36 323/282 |
| 8,502,511 B1* | 8/2013 | Kung | .................. | H02M 3/1588 323/225 |
| 9,998,009 B1* | 6/2018 | Lai | ........................ | H02M 3/157 |
| 2002/0047694 A1* | 4/2002 | Zafarana | ............. | H02M 3/1584 323/282 |
| 2012/0068683 A1* | 3/2012 | Liu | ........................ | H02M 1/08 323/311 |
| 2013/0169258 A1* | 7/2013 | Lai | ...................... | H02M 3/1582 323/311 |
| 2014/0145679 A1* | 5/2014 | Chen | ................... | H02M 3/1582 320/128 |
| 2014/0198534 A1* | 7/2014 | Jovcic | ............... | H02M 3/33584 363/16 |

(Continued)

*Primary Examiner* — Yemane Mehari
(74) *Attorney, Agent, or Firm* — Murphy, Bilak & Homiller, PLLC

(57) ABSTRACT

Methods and circuits are provided for controlling an electronic switch such that it may be controlled by an external control signal, such as a PWM signal, or be set to operate in an active-diode mode, wherein current is allowed to flow through the switch in only one direction. The described circuits are configured to autonomously control the electronic switch, such that no external control signal is required when the active-diode mode is used. The provided techniques allow electronic switches to be efficiently used as part of a power stage or part of an active rectifier, so as to support bi-directional switched-mode power supplies, motor/generator drivers, and related electric circuits that require bi-directional power flow. By reusing electronic switches thusly and implementing an active-diode mode, the circuitry is minimized while maintaining good power efficiency.

18 Claims, 13 Drawing Sheets

(56) References Cited

U.S. PATENT DOCUMENTS

| | | | | |
|---|---|---|---|---|
| 2015/0002097 A1* | 1/2015 | Kung | ............... | H02J 7/0068 320/128 |
| 2015/0311720 A1* | 10/2015 | Zhao | ............... | H02J 7/0068 307/80 |
| 2016/0087544 A1* | 3/2016 | Jin | ............... | H02M 1/32 363/21.02 |
| 2020/0083813 A1* | 3/2020 | Tang | ............... | H02M 3/33553 |

* cited by examiner

METHOD AND DEVICE TO OPERATE A POWER SWITCH IN MULTIPLE MODES

TECHNICAL FIELD

The present application relates to circuits and methods for controlling a power switch and, more particularly, provides techniques in which the conductivity of the power switch may be determined, in a first mode, by a switch control signal and, in a second mode such as an active-diode mode, by a voltage or current of the power switch.

BACKGROUND

Electronic switches are widely used in a variety of applications. In many of these applications, the electronic switches are operated primarily in either a fully on mode or in an off mode. The state wherein a switch is partially on, which may be termed linear or triode mode for some switch types, is avoided, as the power loss during such a state is higher than the loss in the fully on state or in the off state. Common applications that use electronic switches primarily in a fully on or off mode include switched-mode power supplies (SMPSs), electric motor drivers, and charging circuits.

An example of an electronic switch that is commonly used in a fully on or in an off state is the metal-oxide semiconductor field-effect transistor (MOSFET). MOSFETs represent a type of switch that has an intrinsic diode, such that the switch is not capable of blocking current in one direction. When a MOSFET is turned off, e.g., by appropriate setting of the gate voltage applied to the MOSFET, current flow is blocked in one direction, but the intrinsic (body) diode allows current flow in the other direction, provided that the voltage across the intrinsic diode is high enough to forward bias the diode. In many applications that do not require current blocking in both directions through a switch, the intrinsic diode provides a useful property or is at least not harmful.

The electronic switches of an SMPS may be used both in a power stage circuit of the SMPS and in an active rectifier circuit, and the switch control required for these circuits is quite different. Consider, for example, an isolated SMPS wherein a transformer separates primary and secondary sides. Electronic switches within a power stage on the primary side may be switched (controlled) so as to appropriately transfer power from an input to the transformer and, in turn, to the secondary side and an output of the SMPS. The power stage converts a direct-current (DC) voltage into an alternating-current (AC) voltage applied across the transformer. A rectifier converts the AC voltage induced on the secondary side of the transformer into a DC voltage, which is provided at the output. A passive rectifier, e.g., a diode bridge, may be used to provide the DC voltage, but the voltage drop across the diodes leads to power loss that may be unacceptably high in some applications. In particular, SMPSs providing low output voltage, e.g., 3.3V, 1.8V, have very poor efficiency when using diode bridges, as the voltage drop (typically 0.7V) across each diode represents a large portion of the power consumption of the system. The power efficiency of an SMPS may be greatly improved by using electronic switches to perform active rectification, rather than using diode-based passive rectification. The voltage drop across an electronic switch, which is related to the on resistance of the switch, is typically markedly smaller than the voltage drop across a diode, and the resultant power loss incurred by a properly-controlled electronic switch is significantly smaller than the power loss of a diode.

An active rectifier replaces the diodes of a passive rectifier with electronic switches. The switches must be controlled such that current flow is only allowed in one direction which, for a MOSFET, must be in the direction of the intrinsic diode. Meanwhile, the electronic switches of the power stage are controlled in an entirely different manner. In particular, a duty cycle, frequency, and/or phase shift used to control the power stage switches is adjusted, typically, so as to maintain a desired voltage at the output of the SMPS.

A bi-directional SMPS supports a forward power flow from a primary to a secondary side, as described above, and a reverse power flow from the secondary to the primary side. In the reverse direction, a secondary-side power stage must be controlled so as to transfer appropriate energy, whereas the voltage on the primary side must be rectified.

Switch control circuits are desired that are capable of controlling electronic switches in different operational modes, such that an electronic switch may operate to support a power stage or an active rectifier.

SUMMARY

According to an embodiment, a method is provided for controlling a power switch having an intrinsic diode configured to conduct current in a reverse direction of the power switch, wherein the current in the reverse direction cannot be blocked by the power switch. The method comprises receiving a configuration signal indicating an operational mode for the power switch. If an active-diode configuration is indicated, a current and/or voltage of the power switch is sensed and the power switch is turned on if the sensed current and/or voltage indicates positive current in the reverse direction through the power switch. If a normal (PWM) configuration is indicated, the power switch is turned off responsive to receiving a switch control signal directing that the power switch be turned off, and is turned on responsive to receiving a switch control signal directing that the power switch be turned on.

According to an embodiment of a bi-directional switched mode power supply (SMPS), the SMPS comprises first and second SMPS terminals for providing external connections to the SMPS, high and low-side switches, an inductor, a controller, and first and second driver circuits. The high and low-side switches are coupled together at a switching node. The high-side switch is additionally coupled to the first SMPS terminal. The inductor is electrically interposed between the switching node and the second SMPS terminal. The controller is configured to control the power flow between the first and the second SMPS terminals by generating a switch control signal for one of the high-side and the low-side switches. The first driver control circuit is configured to control the high-side switch using an active-diode mode or a normal mode, wherein for the active-diode mode the high-side switch conductivity is based upon a sensed current or voltage of the high-side switch, and for the normal mode the high-side switch conductivity is based upon the switch control signal generated by the controller. Similarly, the second driver control circuit is configured to control the low-side switch using the active-diode mode or the normal mode, wherein for the active-diode mode the low-side switch conductivity is based upon a sensed current or voltage of the low-side switch, and for the normal mode the low-side switch conductivity is based upon the switch control signal provided by the controller. The SMPS is configured to operate, during a first interval, in a first mode in which power is transferred from the first to the second SMPS terminal, and, during a second interval, in a second mode in which power is transferred from the second to the first SMPS terminal.

According to an embodiment of a converter, e.g., a DC/DC or an AC/DC converter, with isolation between the primary side and the secondary side, such as a bi-directional on-board charger (OBC), the converter comprises first and second direct-current (DC) power nodes, each of which is for connecting to a power source or sink, an isolation transformer comprising primary and secondary windings, a primary-side power stage, a secondary-side power stage and a controller. The primary-side power stage couples the first DC power node to the primary winding. The secondary-side power stage couples the secondary winding to the second DC power node. The secondary-side power stage comprises a secondary-side half bridge including first and second secondary-side power switches arranged in a half-bridge configuration. The secondary-side power stage further comprises first and second secondary-side switch controller circuits coupled, respectively, to the first and second secondary-side power switches. Each of the switch controller circuits is configured for operation in a normal mode, in which an externally-provided switch control signal controls conductivity of the power switch coupled to the switch controller circuit, and an active-diode mode, in which conductivity of the power switch coupled to the switch controller is based upon a sensed current and/or voltage of the power switch. The controller is configured to operate the converter, during a first interval, in a forward mode in which power is transferred from the first to the second DC power node, and, during a second interval, in a reverse mode in which power is transferred from the second to the first power node. For the forward mode, the controller sets the secondary-side controller circuits to operate the secondary-side power switches in the active-diode mode. For the reverse mode, the controller sets the secondary-side controller circuits to operate the secondary-side power switches in the normal mode, and generates the externally-provided control signals for the secondary-side power switches.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description that follows.

DETAILED DESCRIPTION

Figure 1:
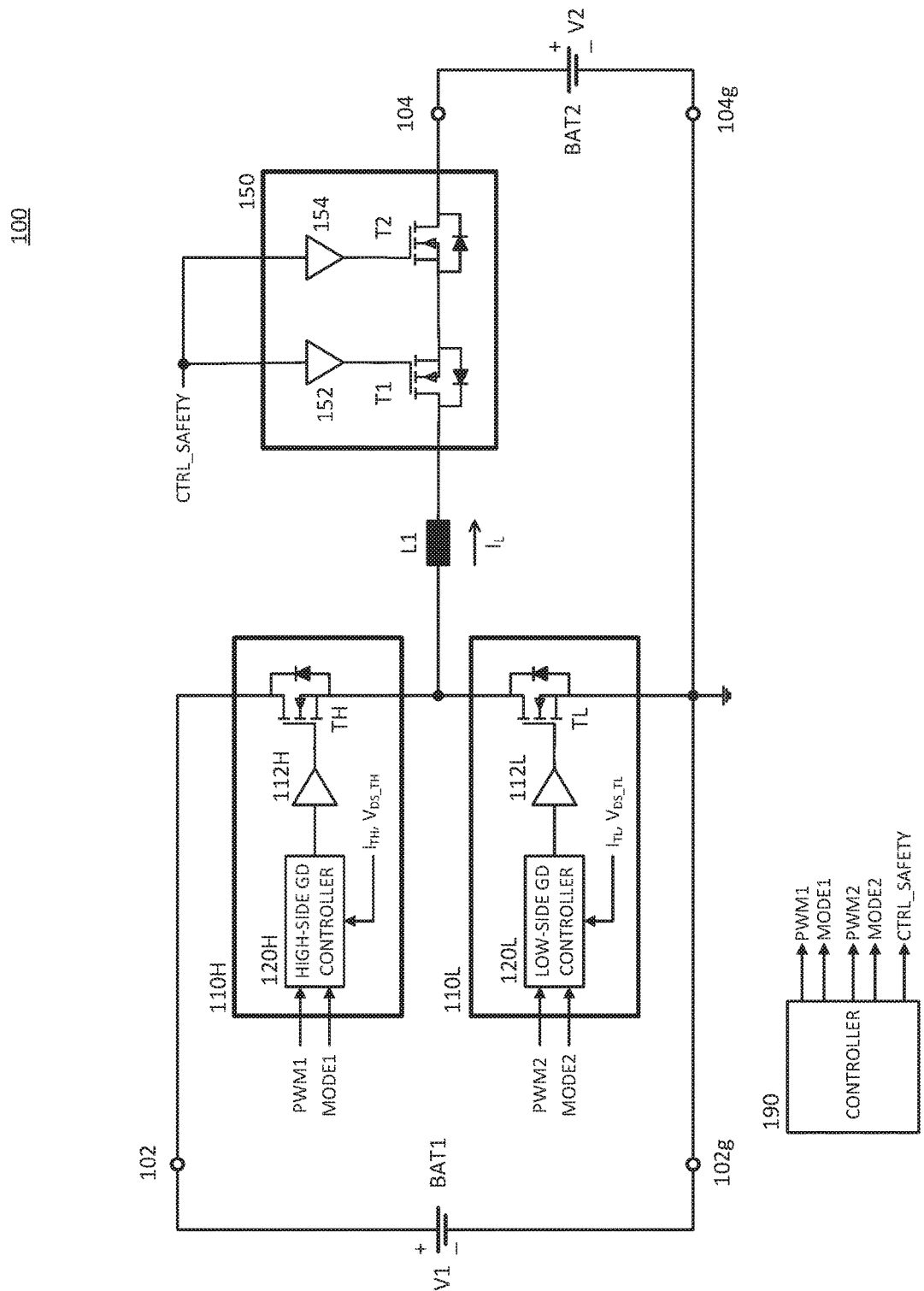
FIG. 1 illustrates a schematic diagram of a switched-mode power supply (SMPS) that may be operated in a buck or a boost mode.

Many electric circuits rely upon electronic switches to generate alternating current (AC) power and/or to rectify AC power in generating direct-current (DC) power. For example, a switched-mode power supply (SMPS), such as a buck or a boost converter, inputs a DC voltage from a power supply, uses a power stage comprised of one or more electronic switches to convert the DC voltage into an AC voltage, and uses a rectifier to convert AC voltage into a DC voltage that is provided at an output. There are numerous circuit topologies for implementing an SMPS, including both isolated and non-isolated voltage converters. Exemplary non-isolated voltage converters include buck and boost converters, and use an inductor as an energy-storage component. Isolated voltage converters including, e.g., flyback and forward converters, use a transformer both for energy storage/transfer and to provide electrical (galvanic) isolation between the input and the output of the converter. While the aforementioned converters vary in their specific circuit topologies, they are similar in that each has a circuit that may be considered a power stage and a circuit that may be considered a rectifier. In a non-isolated buck converter, e.g., a single electronic switch may provide the power stage, whereas a diode may provide the rectifier. In a typical isolated converter, the power stage may be a half bridge that includes two electronic switches, whereas the rectifier may include a diode bridge or similar.

Many modern circuits, including some SMPSs, use active rectification, in which an electronic switch is used to allow current flow in one direction and to block current flow in the other direction, thereby emulating the operation of a diode. Active rectification provides better power efficiency than passive rectification based upon diodes, as the power loss incurred by the voltage drop across the diode may be greatly reduced. However, active rectification requires the generation of control signals for one or more electronic switches such that current is only allowed to flow in the desired direction. The voltage across an electronic switch may be used to determine when the switch should be turned on. For example, a typical enhancement-mode n-channel MOSFET includes a body diode in the direction from the source terminal to the drain terminal of the MOSFET. If the source voltage is greater than the drain voltage, the switch should be turned on so that positive current will flow from the source to the drain of the MOSFET, without requiring use of the body diode and its associated power loss. When the drain voltage is greater than the source voltage, the switch should be turned off, so as to block positive current from flowing from the drain to the source. Additionally or alternatively, a current flow through the switch may be monitored or predicted in other ways, e.g., using the voltage across a shunt resistor, a sensing path of a power switch (wherein part of the switch area is used as sensing element, KILIS) or by measuring the voltage across an inductor or winding that is connected in series with the switch. Dedicated active-diode control circuitry may measure a voltage or current of the switch, and control conductivity of the switch based upon such measurements. The combination of such control circuitry and an electronic switch effectively provides an autonomous active diode, e.g., no external control signal is required for controlling the electronic switch.

In contrast to the electronic switches of an active rectifier, the electronic switches of a power stage are controlled based on externally-provided control signals. In a typical SMPS, a controller, such as a proportional-integral-derivative (PID) controller, generates control signals for one or more electronic switches of a power stage so as to maintain a desired voltage at the output of the SMPS.

An isolated SMPS providing a step-down or a step-up voltage conversion has a primary-side power stage comprised of electronic switches that are controlled by externally-provided control signals, e.g., from a controller operable to regulate an output voltage on the secondary side. Such an SMPS may also have a secondary-side active rectifier comprised of electronic switches operating as autonomous active diodes. In a first mode, power is transferred from the primary to the secondary side, and the output voltage is stepped down or up relative to the input. If the SMPS is bi-directional, the SMPS should also be able to operate in a second mode in which power is transferred from the secondary to the primary side, so as to step-up or step-down a secondary-side input voltage and provide the stepped-up or stepped-down voltage at a primary-side output. In preferred embodiments, the primary-side electronic switches are controlled by the externally-provided control signals in the first operational mode (primary-to-secondary power transfer), and are operated as active diodes in the second operation mode (secondary-to-primary power transfer). Conversely, the secondary-side electronic switches are preferably operated as active diodes in the first operational mode (primary-to-secondary power transfer), and are controlled by externally-provided control signals in the second operational mode (secondary-to-primary power transfer).

Described herein are circuits and methods for controlling electronic switches in multiple modes including, e.g., an active-diode mode and an externally-controlled mode. For safety-critical applications, the switch control may also include protection modes, in which the active-diode operation or externally-controlled operation may be overridden responsive to detection of faults such as a short-circuit or over-current condition. These circuits and methods find particular use in bi-directional SMPSs, wherein one or more electronic switches may be externally-controlled so as to provide a power stage, or may be set to an active-diode mode to provide rectification. While the circuits and methods are described primarily in the context of SMPSs, other devices may also advantageously use these circuits and methods. For example, the electronic switches of a bridge circuit may be actively controlled in a motor mode to set a direction and/or speed of an electric motor/generator. In a generator mode, the electronic switches of the bridge circuit may be set to an active-diode mode, so as to provide active rectification when the motor/generator is operating in a generation mode.

For clarity of explanation, the inventions are described by way of particular exemplary embodiments. It should be understood that the below examples are not meant to be limiting. Circuits and techniques that are well-known in the art are not described in detail, so as to avoid obscuring unique aspects of the invention. Features and aspects from the example embodiments may be combined or re-arranged, except where the context does not allow this.

The description begins with an embodiment of a non-isolated bidirectional buck/boost converter that is configured to operate in a first mode, in which power is transferred in a forward direction, and a second mode, in which power is transferred in a reverse direction. Electronic switches within this buck/boost converter are operated in an active-diode, externally-controlled, or protected mode. The buck/boost converter description is followed by more detailed descriptions of gate drive control circuitry used in providing the different operational modes, and which may be used by the buck/boost converter or by other applications. Next, use of the gate driver control circuitry for motor/generator control is described. In another example, an isolated on-board charger is described, wherein each of a primary and secondary set of electronic switches may be operated in an active-diode or an externally-controlled mode. Finally, a method for controlling a power switch in an active-diode or externally-controlled mode is described.

Buck-Boost Converter with Safety Protection Switches

FIG. 1 illustrates a non-isolated bi-directional voltage converter 100 that may be operated in either a buck or a boost mode, and first and second batteries BAT1, BAT2 connected to the voltage converter 100. Depending upon the power flow direction, each battery may operate as either a power source or as a power sink (load). As illustrated, the first battery BAT1 has a first voltage V1 that is higher than the voltage V2 of the second battery. For example, the first battery BAT1 may have a nominal voltage of 48V, whereas the second battery BAT2 has a nominal voltage of 12V. The voltage converter 100, as illustrated in FIG. 1, may be used to transfer energy between two energy sources for, e.g., an automotive application, in either direction. When energy is transferred from the first battery BAT1 to the second battery BAT2, the voltage converter 100 operates in a buck (step-down) mode and the second battery BAT2 is charged. When energy is transferred in the opposite direction, the voltage converter 100 operates in a boost (step-up) mode, so as to charge the first battery BAT1. Hence, the voltage converter 100 is a type of buck-boost converter.

The voltage converter 100 comprises a first terminal 102 for connection to an external power source/sink, such as the first battery BAT1, and a second terminal 104 for connection to another external power source/sink, such as the second battery BAT2. In addition to the illustrated batteries BAT1, BAT2, additional power source/sinks, such as motors or generators, may also be connected to the terminals 102, 104 of the voltage converter 100, e.g., in parallel to the batteries BAT1, BAT2. The voltage converter 100 includes a high-side switch TH, a high-side gate driver 112H for driving said switch TH, and a high-side gate drive controller 120H for controlling the gate driver 112H, which together comprise a high-side switch circuit 110H. The components of the high-side switch circuit 110H may be monolithically integrated. The voltage converter 100 includes a similar low-side switch circuit 110L, which includes a low-side switch TL, a low-side gate driver 112L, and a low-side gate drive controller 120L. The voltage converter 100 additionally includes an inductor L1 and may optionally include a protection isolator circuit 150. The protection circuit 150 includes protection switches T1, T2, which are driven by respective gate drivers 152, 154. The protection circuit 150 is included for safety-critical applications, including automotive applications, and may be used to isolate the batteries BAT1, BAT2 from each other or from ground in case of, e.g., a short fault across one of the switches TH, TL.

As compared with prior voltage converter control, the high-side and low-side gate-drive controllers 120H, 120L enable the voltage converter 100 to control an associated switch in one of several modes and, thereby, allow each of the switch circuits 110H, 110L to be operated in multiple modes, including a pulse-width-modulated (PWM) mode and an active-diode mode, as indicated by the mode signals MODE1, MODE2. Additionally, the mode signals may indicate safety cutoff modes, wherein a switch should be turned off responsive to an external or internal indication of a fault. The different modes will be explained more thoroughly further below in conjunction with the descriptions of FIGS. 2A, 2B, 3A, and 3B.

The voltage converter 100 further includes a controller 190, which generates control signals for the gate-drive controllers 120H, 120L and the protection circuit 150. A first mode signal MODE1 generated by the controller 190 indicates whether the high-side gate drive controller 120H should operate in a PWM mode, an active-diode mode, or otherwise. When the first mode signal MODE1 indicates the PWM mode, a first PWM signal PWM1 generated by the controller 190 controls conductivity of the high-side switch TH, via the gate driver 112H. For example, a PID controller within the controller 190 may generate the first PWM signal PWM1 to maintain a desired target voltage across the battery BAT2. When the first mode signal MODE1 indicates active-diode mode, the signal PWM1 is ignored by the high-side GD controller 120H, and conductivity of the high-side switch TH is based upon the current $I_{TH}$ through the high-side switch TH, a drain-source voltage $V_{DS\_TH}$ of the high-side switch TH, or a similar signal of the high-side switch circuit 110H. In this way, the high-side switch circuit 110H may operate autonomously in the active-diode mode, without relying on PWM control signals from the controller 190. In this mode, the controller 190 does not need to generate a control signal PWM1 and does not need to sense currents or voltages of the high-side switch TH to do so. In addition to relieving the controller 190 from generating the first PWM control signal PWM1, delays in sensing currents or voltages by controller 190 may be eliminated or, at least, reduced.

Corresponding mode and PWM signals MODE2, PWM2 similarly configure and control the low-side GD controller 120L. The safety switches T1, T2 of the protection circuit 150 are turned on by the safety control signal CTRL_SAFETY, which is generated by the controller 190. If the controller detects a fault in the voltage converter 100, e.g., excessive current flow from one of the batteries BAT1, BAT2 or a battery voltage V1, V2 outside of a normal (non-fault) range, the controller 190 turns off the safety switches T1, T2 using the safety control signal CTRL_SAFETY.

The controller 190 and its constituent parts may be implemented using a combination of analog hardware components (such as transistors, amplifiers, diodes, resistors, analog-to-digital converters), and processor circuitry that includes primarily digital components. The processor circuitry may include one or more of a digital signal processor (DSP), a general-purpose processor, and an application-specific integrated circuit (ASIC). The controller 190 may also include memory, e.g., non-volatile memory such as flash, that includes instructions or data for use by the processor circuitry, and one or more timers. The controller 190 inputs sensor signals such as signals corresponding to the battery voltages V1, V2, and the current I1 of the inductor L1.

The high and low-side switches TH, TL illustrated in FIG. 1 are enhancement-mode metal-oxide semiconductor field-effect transistors (MOSFETs), but other switch types may be used. For example, junction field-effect transistors (JFETs), bipolar junction transistors (BJTs), insulated gate bipolar transistors (IGBTs), high electron mobility transistors (HEMTs), or other types of power transistors may be preferred in some applications. Note that not all of these switch types have intrinsic diodes. The power switches described in the embodiments that follow are also illustrated as MOSFETs, but may be replaced with other switch types.

Figure 2A:
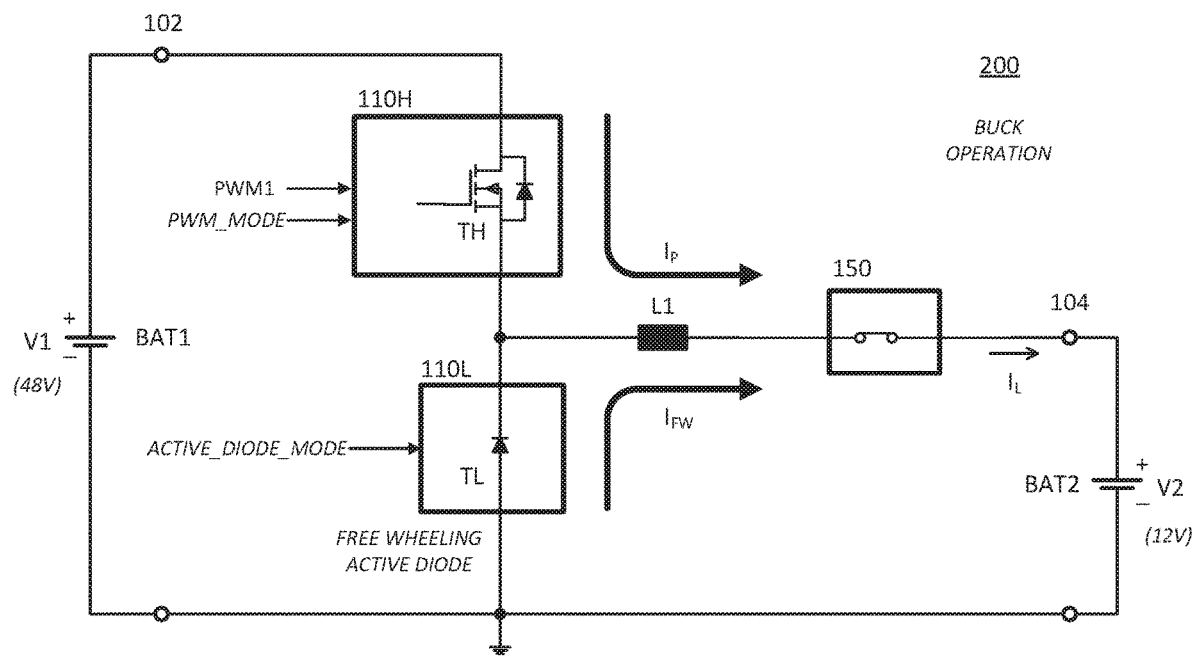
FIG. 2A illustrates a schematic diagram of the SMPS of FIG. 1 when operated in a buck mode.
Figure 2B:
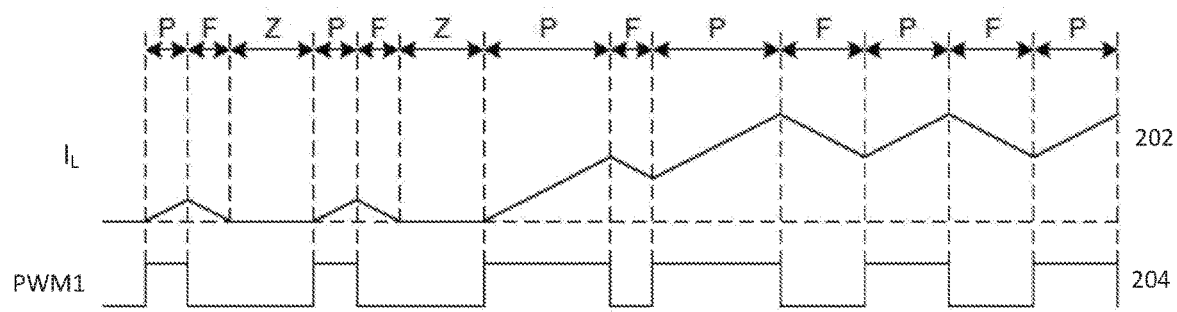
FIG. 2B illustrates waveforms corresponding to the diagram of FIG. 2A.

FIG. 2A provides a schematic diagram 200 corresponding to the voltage converter 100 of FIG. 1, when the voltage converter 100 is operated in a buck mode of operation. FIG. 2B illustrates waveforms corresponding to the buck-mode operation of this voltage converter. The illustrated voltage converter 200 inputs power from the battery BAT1, having a voltage of 48V, and outputs power to (charges) the battery BAT2, having a voltage of 12V. The controller 190, which is not shown for ease of illustration, generates signals MODE1, MODE2, and PWM1 for controlling the high and low-side switch circuits 110H, 110L.

The mode signal for the high-side switch circuit 110H is set to PWM_MODE, so that the high-side switch TH is controlled by the control signal PWM1. The low-side mode signal is set to ACTIVE_DIODE_MODE, thereby setting the low-side switch circuit 110L to only allow positive current flow in the illustrated direction $I_{FW}$. The low-side switch TL is illustrated as a free wheeling diode, but it should be understood that this is accomplished by internally controlling, within the low-side switch circuit 110L, the switch TL to be turned on when the low-side switch TL would otherwise have current flow through its body diode. The controller 190 need not generate the switch control signal PWM2 for the low-side switch TL; the low-side switch circuit 110L operates autonomously based upon internally-sensed voltage(s) and/or current(s).

A positive current $I_P$ flows through the high-side switch TH and the inductor L1 when the high-side switch TH is turned on. A positive current $I_{FW}$ flows through the low-side switch TL and the inductor L1 when the low-side switch TL is turned on. Both of these currents $I_P$, $I_{FW}$ flow through the inductor $I_L$, and correspond to the inductor current $I_L$.

FIG. 2B illustrates a waveform 204 for the high-side control signal PWM1 and a waveform 202 for the inductor current $I_L$. During positive intervals, denoted 'P,' the control signal PWM1 turns on the high-side switch TH, via the high-side GD controller 120H, thereby leading to an increase in the inductor current $I_L$. Each positive interval is followed by a freewheeling interval, denoted 'F,' during which the inductor current $I_L$ decreases. The rate at which the current $I_L$ rises or falls during these intervals P, F is determined by the voltage difference across the inductor L1, i.e., V1-V2 if voltage drops across the switches are ignored, and the inductance of the inductor L1. If the current $I_L$ during a freewheeling interval falls to zero, a zero interval, denoted 'Z,' follows the freewheeling interval and the voltage converter 200 operates in discontinuous conduction mode (DCM). If the high-side control signal PWM1 is always activated again before the current $I_L$ falls to zero during each of the freewheeling intervals or if the current $I_L$ is allowed to become negative, the voltage converter 200 operates in continuous conduction mode (CCM). DCM provides power-saving advantages for converters that often operate in low-power modes, whereas CCM provides simpler control for some topologies.

Figure 3A:
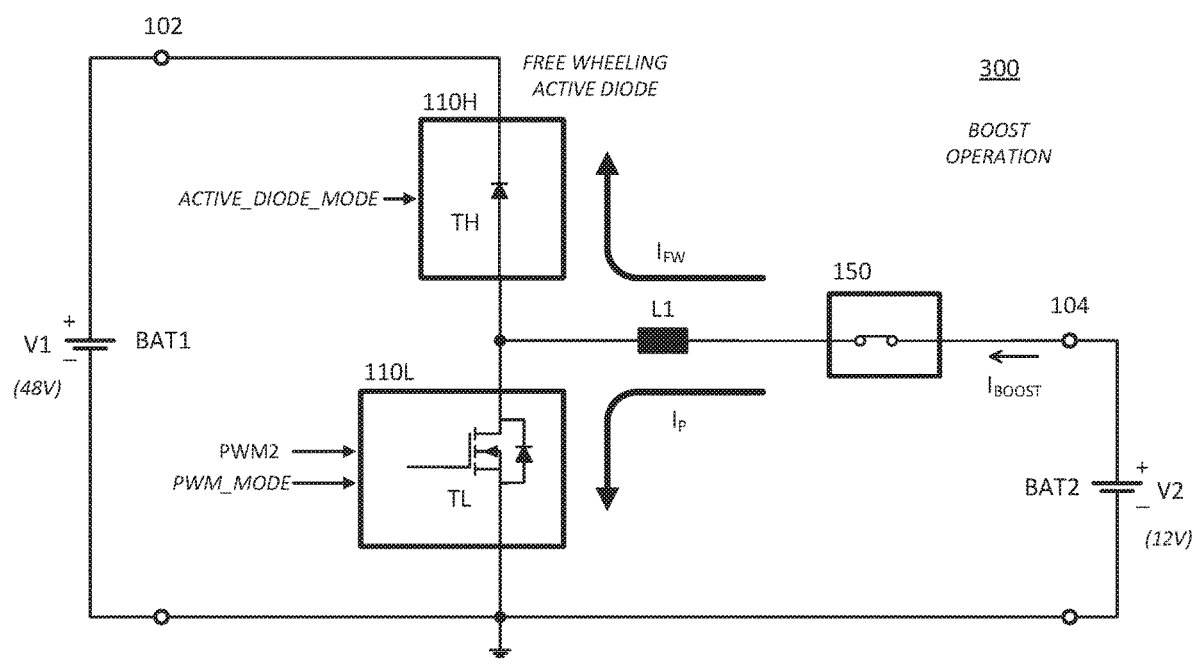
FIG. 3A illustrates a schematic diagram of the SMPS of FIG. 1 when operated in a boost mode.
Figure 3B:
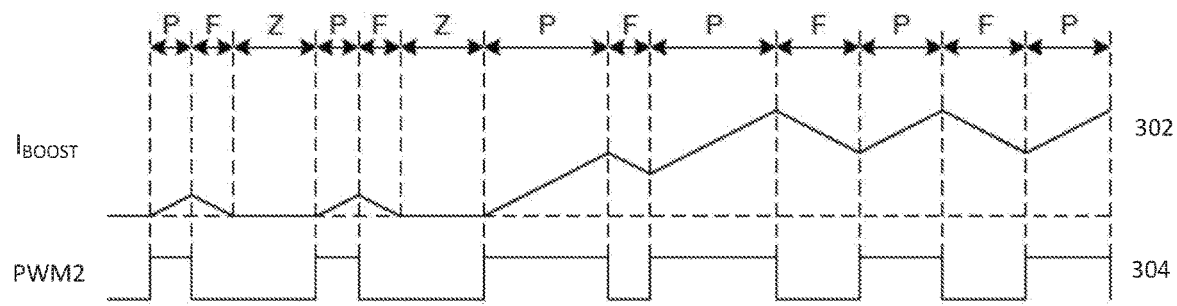
FIG. 3B illustrates waveforms corresponding to the diagram of FIG. 3A.

FIG. 3A provides a schematic diagram 300 of a voltage converter operating in a boost mode of operation, i.e., where power flows from the second battery BAT2 to the first battery BAT1. FIG. 3B illustrates waveforms corresponding to the boost-mode operation of this voltage converter. The controller 190, which is not shown for ease of illustration, generates signals MODE1, MODE2, and PWM2 for controlling the high and low-side switch circuits 110H, 110L. Positive current $I_{BOOST}$ flows in the illustrated direction, which is opposite to the direction $I_L$ shown in FIG. 2A.

The mode signal for the low-side switch circuit 110L is set to PWM_MODE, so that the low-side switch TL is controlled by the control signal PWM2. The high-side mode signal is set to ACTIVE_DIODE_MODE, thereby setting the high-side switch circuit 110H to only allow positive current flow in the illustrated direction $I_{FW}$. The high-side switch TH is illustrated as a freewheeling diode, but it should be understood that this is accomplished by internally controlling the switch TH to be turned on when the high-side switch TH would otherwise have current flow through its body diode. The controller 190 need not generate the switch control signal PWM1 for the high-side switch TH; the high-side switch circuit 110H operates autonomously based upon internally sensed voltage(s) and/or current(s).

A positive current $I_P$ flows through the inductor L1 and the low-side switch TL when the low-side switch TL is turned on. A positive current $I_{FW}$ flows through the inductor L1 and the high-side switch TH when the high-side switch TH is turned on. Both of these currents $I_P$, $I_{FW}$ flow through the inductor $I_L$, and correspond to the boost current $I_{BOOST}$.

FIG. 3B illustrates a waveform 304 for the low-side control signal PWM2 and a waveform 302 for the boost current $I_{BOOST}$. During positive intervals, denoted 'P,' the control signal PWM2 turns on the low-side switch TL, via the low-side GD controller 120L, thereby leading to an increase in the boost current $I_{BOOST}$. Each positive interval P is followed by a freewheeling interval, denoted 'F,' during which the boost current $I_{BOOST}$ decreases. As in the buck operation described above, if the current $I_{BOOST}$ during a freewheeling interval falls to zero, a zero interval 'Z' follows the freewheeling interval and the voltage converter 300 operates in discontinuous conduction mode (DCM), as illustrated.

Figure 4:
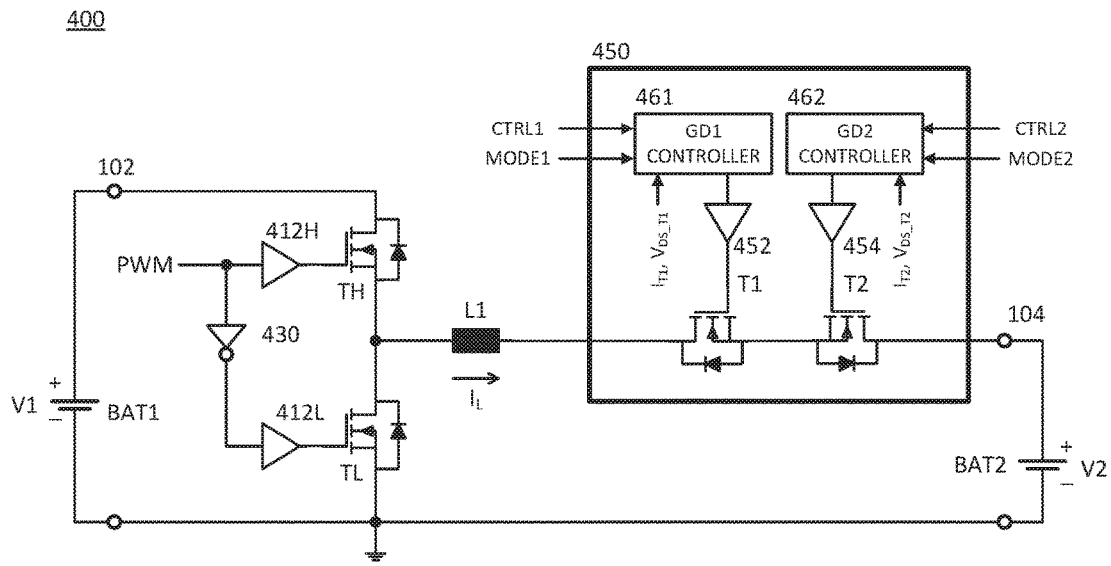
FIG. 4 illustrates a schematic diagram of an alternative SMPS in which current blocking is provided by safety switches rather than switches within a power stage.

FIG. 4 illustrates a schematic diagram 400 for an alternative configuration of a buck-boost converter. This voltage converter 400 is similar to the converter 100 of FIG. 1, but the active rectification is provided by the safety circuit 450 rather than the high or low-side switches TH, TL.

The high and low-side switches TH, TL and their respective gate drivers 412H, 412L are arranged in a half-bridge configuration. An inverter 430 is configured such that the low-side switch TL is turned on whenever the high-side switch TH is turned off, and vice-versa. (Additionally, a brief dead-time during which neither switch is turned on is typically included at switch transitions to avoid shoot-through. For ease of illustration, circuitry to implement such dead-time intervals is not explicitly shown.) This arrangement avoids use of the high and low-side GD controllers 110L, 110H, thereby simplifying the power stage. A controller controls the switches TH, TL using a single PWM control signal for either buck or boost mode. Without some other rectification, this arrangement leads to CCM, which may lead to undesired current flows in some situations.

To address this problem, the safety circuit 450 is configured to also provide active rectification. In addition to the safety switches T1, T2 and their respective drivers 452, 454, the safety circuit 450 includes a GD1 controller 461 and a GD2 controller 462. These controllers 461, 462 are configured similarly to the controllers 120L, 120H of FIG. 1. Notably, each of the GD controllers 461, 462 may be operated in multiple modes, including a direct-control mode, which is similar to the PWM mode described for controller 110H, 110L, and an active-diode mode. The mode signals MODE1, MODE2 determine the mode (e.g., direct-control or active-diode mode) for the GD controllers 461, 462, whereas the control inputs CTRL1, CTRL2 determine the conductivity of the switches T1, T2 when the mode is set to the direct-control mode. The mode and control signals MODE1, MODE2, CTRL1, CTRL2 are typically generated by a controller, such as the controller 190 described previously. For ease of illustration, such a controller is not shown.

When the first mode signal MODE1 is set to the active-diode mode, conductivity of the first switch T1 is controlled such that the switch T1 is turned on whenever current would otherwise flow through the body diode of the switch T1. For the illustrated MOSFET, this corresponds to a current flowing from the source terminal to the drain terminal of the switch T1. Such operation requires no external intervention, e.g., generation of a switch control signal from a controller. In the active-diode mode, the first switch circuit, which is comprised of the first switch T1, the first gate driver 452, and the GD1 controller 461, operates autonomously to provide active-diode functionality. Note that the mode may also be set without providing the dedicated mode control signal MODE1 as indicated, e.g., the mode may be stored within a configuration register of the GD1 controller 461. GD2 controller 462, the second gate driver 454, and the second safety switch T2 operate in a manner similar to that described above.

Figure 5:
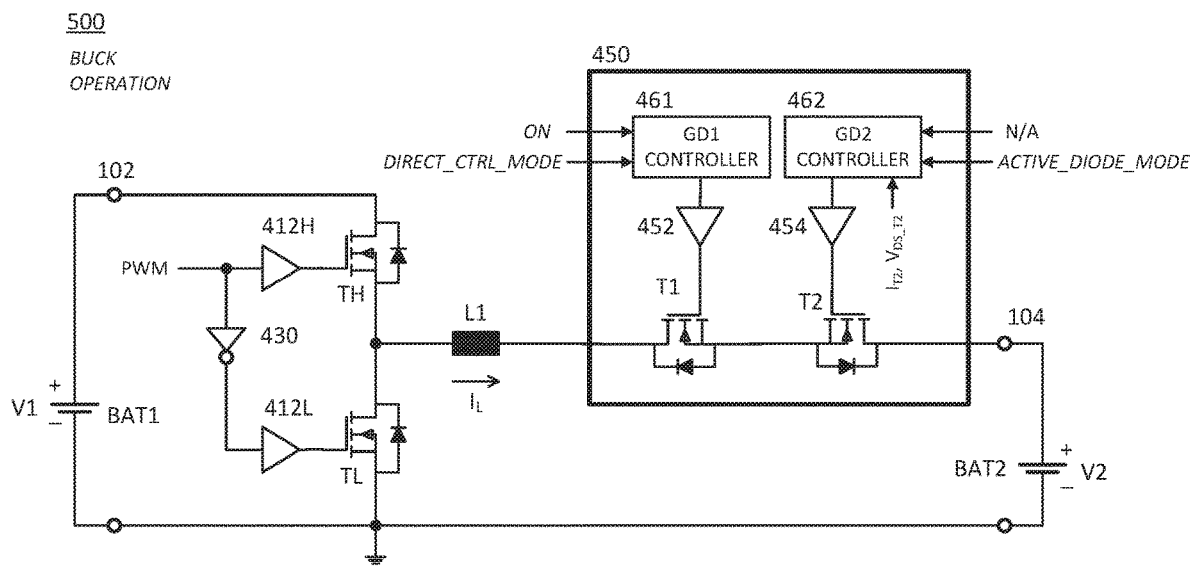
FIG. 5 illustrates a schematic diagram of the SMPS of FIG. 4 when the SMPS is operated in a buck mode.

FIG. 5 illustrates a schematic diagram 500 corresponding to the voltage converter 400 of FIG. 4, when the voltage converter 400 is operated in a buck mode of operation. For the GD1 controller 461, the first mode MODE1 is set to the direct-control mode, and the first control input CTRL1 is set to ON such that the first switch T1 conducts. The mode MODE2 of the GD2 controller 462 is set to the active-diode mode, in which the second control input CTRL2 is not used. In this mode, the GD2 controller 462 uses a voltage or current of the second switch T2 to turn on the second switch T2 whenever there is a potential current flow in the direction from the switch source terminal to the switch drain terminal, i.e., in the direction of positive current flow $I_L$. The GD2 controller 462 senses a current, e.g., $I_L$, or a voltage, e.g., the drain-source voltage $V_{T2\_DS}$, of the second safety switch T2 to determine when to turn on the second safety switch T2, so as to only allow current flow in the desired direction, i.e., towards the second battery BAT2. Such operation allows DCM, and its associated power-saving advantages during periods of low power transfers, when using a conventional half bridge and relatively simple control for the power stage. The resultant PWM control of the half bridge and the inductor current $I_L$ are similar to the waveforms 204, 202 illustrated in FIG. 2B.

While not explicitly illustrated, the voltage converter 400 of FIG. 4 may also be operated in a boost mode by setting the GD1 controller 461 to the active-diode mode, setting the GD2 controller 462 to the direct-control mode, and setting the second control input CTRL2 to ON. Such operation only allows positive current in the direction from the second terminal 104 to the first terminal 102, i.e., opposite to the illustrated current flow direction $I_L$. Such a configuration also allows DCM while operating the half bridge (TH, TL) in a simple manner, and results in PWM and current waveforms 304, 302 similar to those illustrated in FIG. 3B.

Gate Drive Controller

Figure 6A:
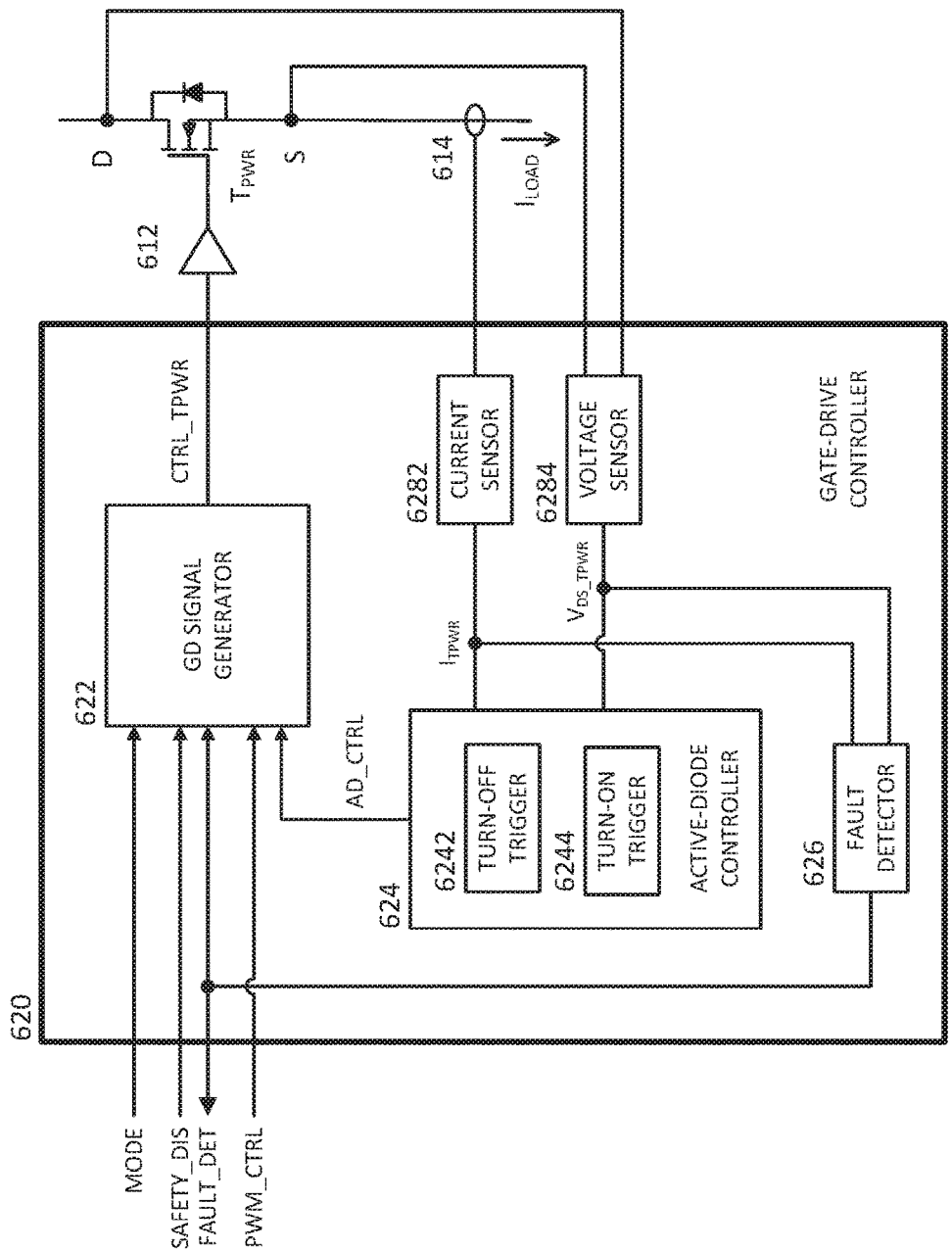
FIG. 6A illustrates a schematic diagram of a gate-drive controller and its connection to a power switch.

FIG. 6A illustrates a gate-drive controller 620, as could be used for any of the gate-drive controllers 120H, 120L, 461, 462 described previously in conjunction with FIGS. 1 and 4. The gate-drive controller 620 provides a control signal CTRL_TPWR for driving a gate driver 612 which, in turn, drives a power switch $T_{PWR}$. The power switch $T_{PWR}$ could be any of the high-side, low-side, or safety switches TH, TL, T1, T2 described previously. The gate-drive controller 620 comprises a gate-drive signal generator 622, an active-diode controller 624, a fault detector 626, a current sensor 6282, and a voltage sensor 6284.

The active-diode-mode operation is implemented using the active-diode controller 624 and one or both of the sensors 6282, 6284. The voltage sensor 6284 is configured to measure the drain-to-source voltage of the power switch $T_{PWR}$, and provide the result $V_{DS\_TPWR}$ to the active-diode controller 624. The current sensor 6282 is configured to measure a current 614 of the power transistor $T_{PWR}$, and to provide the result $I_{TPWR}$ to the active-diode controller 624. The current $I_{TPWR}$ may be sensed, e.g., using a shunt resistor in series with the power switch $T_{PWR}$, using a DCR circuit, or using the drain-to-source voltage $V_{DS\_TPWR}$ of the power transistor $T_{PWR}$.

In a preferred embodiment, a turn-on trigger 6244 activates an active-diode control signal AD_CTRL when the drain-to-source voltage $V_{DS\_TPWR}$ is below an activation threshold $V_{DS\_THR}$, which is negative. Stated alternatively, the source-to-drain voltage of the power transistor $T_{PWR}$ should be above a threshold that prevents the body diode from carrying current through the power switch $T_{PWR}$. For example, the body diode may be forward biased at a source-to-drain voltage of 0.7V, in which case the power switch $T_{PWR}$ should be turned on if the drain-to-source voltage $V_{DS\_TPWR}$ is below, e.g., −0.1V or −0.2V. (Stated alternatively, the source-to-drain voltage is above 0.1V or 0.2V.)

In the active-diode mode, the power switch $T_{PWR}$ is preferably turned off when the current through the switch $T_{PWR}$ is zero, as may be sensed by the current sensor 6282. Due to delays of the GD signal generator 622 and the gate driver 612, it may be desirable to trigger the turn off of the power switch $T_{PWR}$ before the current magnitude reaches zero. This is done by a turn-off trigger circuit 6242 of the active-diode controller 624, which compares the sensed current $I_{TPWR}$ against a threshold $I_{TPWR\_THR}$, and deactivates the active-diode control signal AD_CTRL responsive to detecting that the magnitude of this current reaches the magnitude of the threshold current $I_{TPWR\_THR}$. For the illustrated current direction $I_{LOAD}$, the threshold $I_{TPWR\_THR}$ is a small negative value and the switch turn off is triggered when $I_{LOAD} > I_{TPWR\_THR}$, wherein the current $I_{LOAD}$ is negative when current flows in the direction of the body diode of the power switch $T_{PWR}$.

In preferred embodiments, the body diode does not carry any current. If the power switch is turned off too soon, the body diode may be activated which leads to a sudden change in the drain-to-source voltage of the power switch $T_{PWR}$. This, in turn, may lead to undesired electromagnetic interference (EMI). To avoid such problems, the current threshold $I_{TPWR\_THR}$ may be set such that the switch $T_{PWR}$ is not turned off until the current direction $I_{LOAD}$ reverses, and a small level of positive current flows in the illustrated direction of $I_{LOAD}$.

The above-described active-diode controller 624 uses the sensed voltage $V_{DS\_TPWR}$ to trigger the turn-on of the switch $T_{PWR}$, and uses the sensed current $I_{TPWR}$ to trigger the turn-off of the switch $T_{PWR}$. In other embodiments, the sensed voltage $V_{DS\_TPWR}$ may be used to trigger both the turn on and turn off of the power switch $T_{PWR}$. However, detecting the low voltage levels necessary to accurately turn off the power switch $T_{PWR}$ at near zero current is difficult, so the preferred embodiments use the sensed current $I_{TPWR}$ to trigger the turn off. In yet other embodiments, the sensed current $I_{TPWR}$ may be used to trigger both the turn on and turn off. For such an embodiment, the turn on requires some current flow in the direction of the body diode to detect sensed current $I_{TPWR}$ in the desired direction. This means that the body diode will be used for at least a brief period of time at each turn on transition, which incurs an unnecessary power loss and, potentially, a high level of EMI. Hence, this technique is not preferred.

The gate-drive (GD) signal generator 622 generates the switch control signal CTRL_TPWR based upon a mode, a safety disable signal (SAFETY_DIS), a PWM control signal (PWM_CTRL), and an active-diode control signal (AD_CTRL). If the MODE indicates active-diode mode, the GD signal generator 622 bases its output on the active-diode control signal (AD_CTRL) provided by the active-diode controller 624 within the GD signal generator 622. If the MODE indicates a PWM (direct-control) mode, the switch control signal CTRL_TPWR is based upon the externally-provided PWM control signal. Additionally, a safety disable (SAFETY_DIS) signal may statically disable the GD signal generator 622. The SAFETY_DIS signal may be generated by a controller, such as the controller 190, when a fault is detected in the system and the power switch $T_{PWR}$ should be disabled so as to stop current flow.

The fault detector 626 may use the voltage $V_{DS\_TPWR}$ or current $I_{TPWR}$ of the power switch $T_{PWR}$ to detect faults. For example, a voltage $V_{DS\_TPWR}$ or current $I_{TPWR}$ having a magnitude above an acceptable value may indicate a problem, in which case the fault detector 626 issues a fault detect signal FAULT_DET. The fault detect signal may be output from the gate-drive controller 620, and may also be provided to the GD signal generator 622 so as to disable the control signal CTRL_TPWR. The fault detector 626 preferably operates during both active-diode and PWM modes. In active-diode mode, the active-diode controller 624 and the fault detector 626 operate to only turn on the power switch TPWR when the current $I_{LAD}$ is within a range between the threshold current $I_{TPWR\_THR}$, and a safety cutoff threshold $I_{TPWR\_SAFETY}$, wherein the currents $I_{LOAD}$, $I_{TPWR\_THR}$, and $I_{TPWR\_SAFETY}$ are negative for the illustrated direction of $I_{LOAD}$.

Figure 6C:
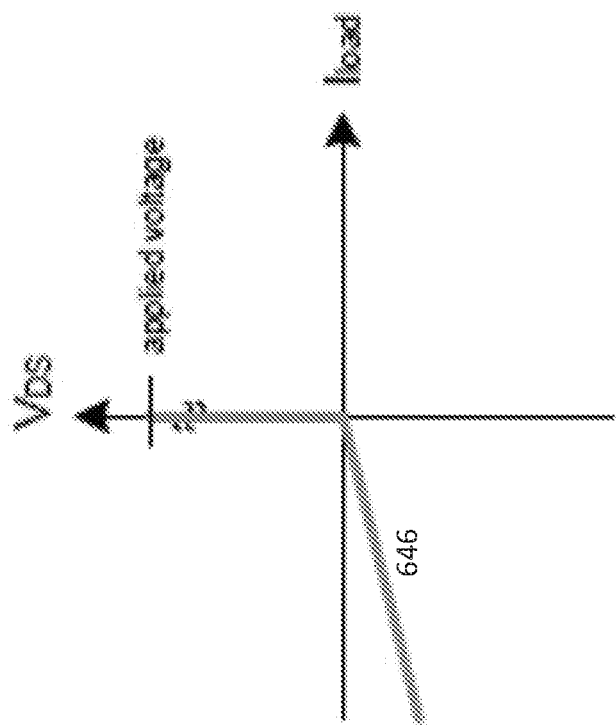
FIGS. 6B and 6C illustrate voltage-to-current relationships for the power switch under the control of the gate-drive controller.
Figure 6B:
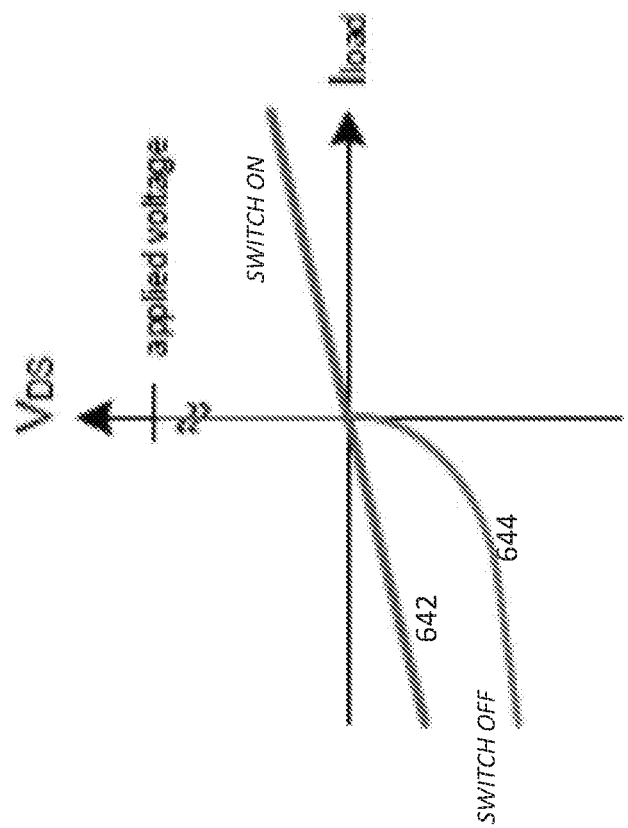

FIG. 6B illustrates voltage-current mappings for the power switch $T_{PWR}$ for the direct-control (PWM) mode. Curve 642 illustrates the mapping when the switch is turned on, e.g., by the PWM_CTRL signal, whereas curve 644 illustrates the mapping when the switch is turned off. FIG. 6C illustrates a voltage-current mapping 646 for the power switch $T_{PWR}$ for the active-diode operational mode.

Alternative Gate Drive Controllers

The current $I_{LOAD}$ flowing through the power switch $T_{PWR}$ of FIG. 6 may be very large for some implementations, which may make sensing this current difficult. For example, if the current $I_{LOAD}$ is sensed using a shunt resistor (e.g., at 614), the high current may lead to a high power loss in the shunt resistor and the need to use a shunt resistor rated for high power. Additionally, the high current (and associated power) may make the monolithic integration of the gate-drive controller 620, the gate driver 612, and the power switch $T_{PWR}$ unfeasible. The gate-drive controller 720 and associated circuitry illustrated in FIG. 7 address such issues. Unless described otherwise, the components of the gate-driver controller 720 may be presumed similar to corresponding components in FIG. 6, though the gate-drive controller 720 omits some signals and components that are not relevant to the differences in the gate-drive controllers 620, 720.

The power switch $T_{PWR}$ is augmented with a mirror switch $T_{MIR}$, which carries a current $I_{TMIR}$ that is proportional to the current through the power switch $T_{PWR}$. For example and as is conventional, the mirror switch $T_{MI}$ may be fabricated in the same technology as the power switch $T_{PWR}$, but have a different size (width, length) such that the current carried by the mirror switch $T_{MIR}$ is proportionally smaller, e.g., the currents through the switches $T_{PWR}$, $T_{MIR}$ may be related with a 1000:1 ratio. A coefficient relating the load current to the sensing current, which is often termed KILIS, may be used to quantify this ratio. The switches $T_{MIR}$, $T_{PWR}$ are controlled by the same gate driver 712. The mirror switch $T_{MIR}$ may be a part of the power switch $T_{PWR}$ that is not connected to the load source terminal S, but to a sensing output. The current $I_{TMIR}$ through the mirror switch $T_{MIR}$ may be used to estimate the load current $I_{LOAD}$. For example, the connection 714 from the mirror switch $T_{MIR}$ may include a shunt resistor, and the current sensor 7282 may use a voltage across the shunt resistor to estimate the current $I_{TMIR}$ and the associated current $I_{LOAD}=\alpha I_{TMIR}$, where $\alpha$ is a positive coefficient related to the relative sizes of the switches $T_{MIR}$, $T_{PWR}$. Such an implementation has the advantage that the power loss and power rating of the shunt resistor may be reduced relative to the circuit of FIG. 6.

Figure 7:
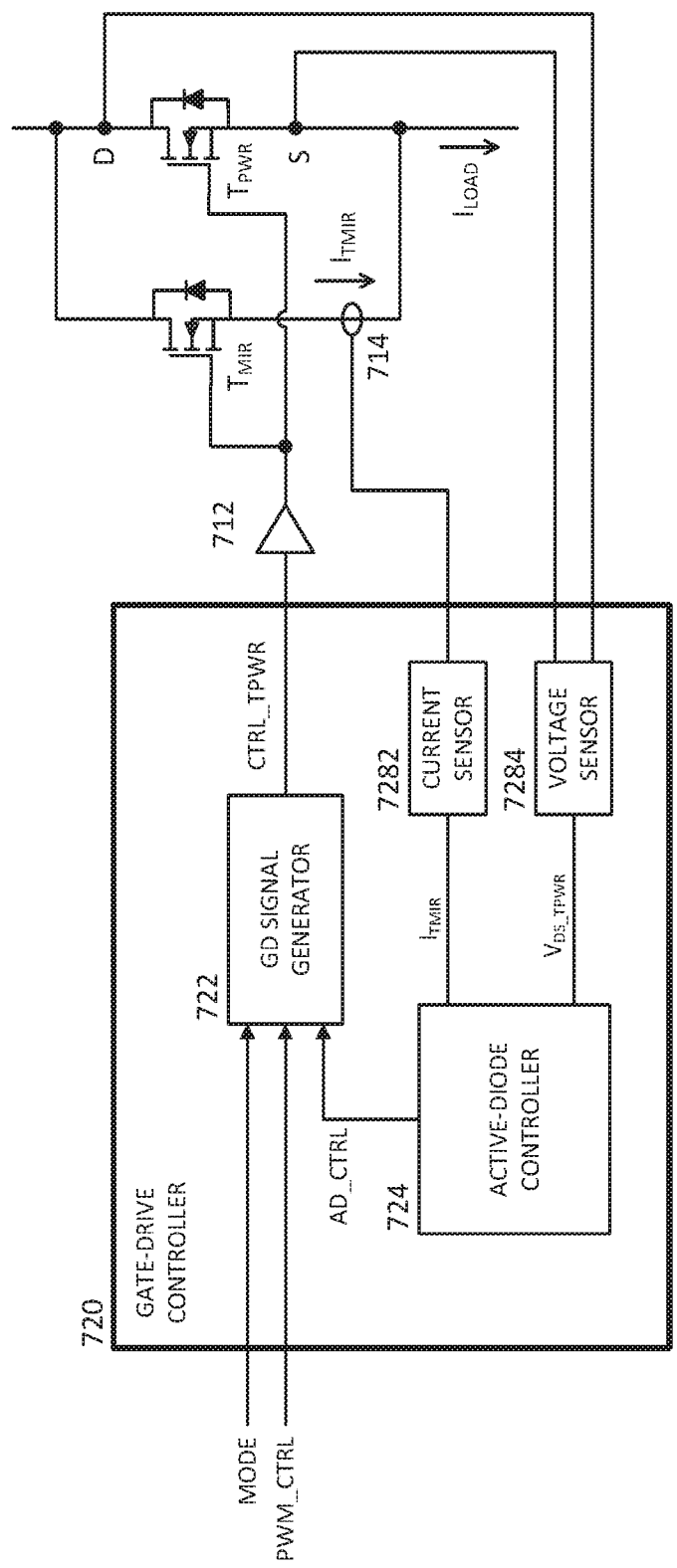
FIG. 7 illustrates a schematic diagram of a gate drive controller that makes use of a transistor mirror for sensing a current of a power switch.
Figure 8:
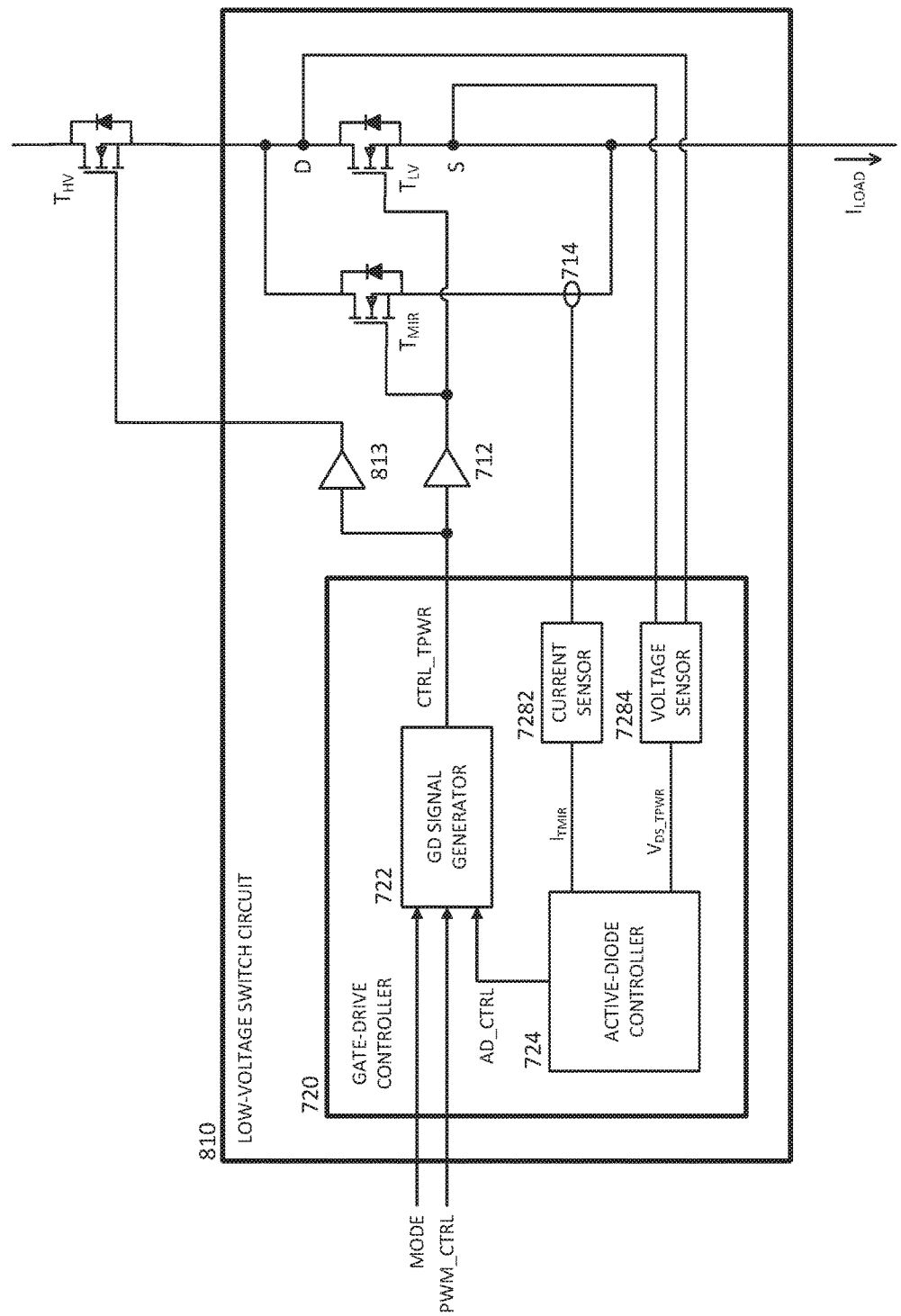
FIG. 8 illustrates a schematic diagram of a switch circuit that makes use of a low-voltage and a high-voltage power switch.

In some implementations, the circuitry illustrated in FIG. 7 is monolithically integrated on the same semiconductor. The gate-drive controller 720 comprises primarily digital circuitry that may be implemented with low-cost low-voltage semiconductor processes capable of handling voltage below, e.g., 20V. The mixed-signal circuitry, e.g., the current sensor 7282, voltage sensor 7284, and gate driver 712, may also be implemented using low-voltage circuitry, except that the voltage $V_{DS\_TPWR}$ across the power switch $T_{PWR}$ may be too large to be sensed by a voltage sensor implemented in a low-voltage semiconductor process. The range of this voltage $V_{DS\_TPWR}$ may be determined by system components, such as the batteries BAT1, BAT2 of FIG. 1. FIG. 8 illustrates a low-voltage switch circuit 810, which achieves the desired monolithic integration to a high extent while also accommodating high voltage levels that are required by other circuitry with the system.

The power switch $T_{PWR}$ of FIG. 7 is partitioned into a high-voltage switch $T_{HV}$ and a low-voltage switch $T_{LV}$ in the circuit of FIG. 8. The high-voltage switch $T_{HV}$ is configured to accommodate a high voltage drop across its drain and source terminals, such that the low-voltage switch $T_{LV}$ need only support a low voltage across its drain and source terminals, as may be supported by a low-voltage semiconductor process. The low-voltage switch $T_{LV}$ may thus be integrated with the gate-drive controller 720, which is able to sense the relatively low voltage $V_{DS\_LV}$ of the low-voltage switch $T_{LV}$. The high-voltage switch $T_{HV}$ is implemented outside of the monolithically-integrated low-voltage switch circuit 810 and may, e.g., be a discrete power switch. The high-voltage switch $T_{HV}$ is controlled in the same manner as described previously, but may require a different gate driver 813 to accommodate its gate voltage requirements.

Figure 9:
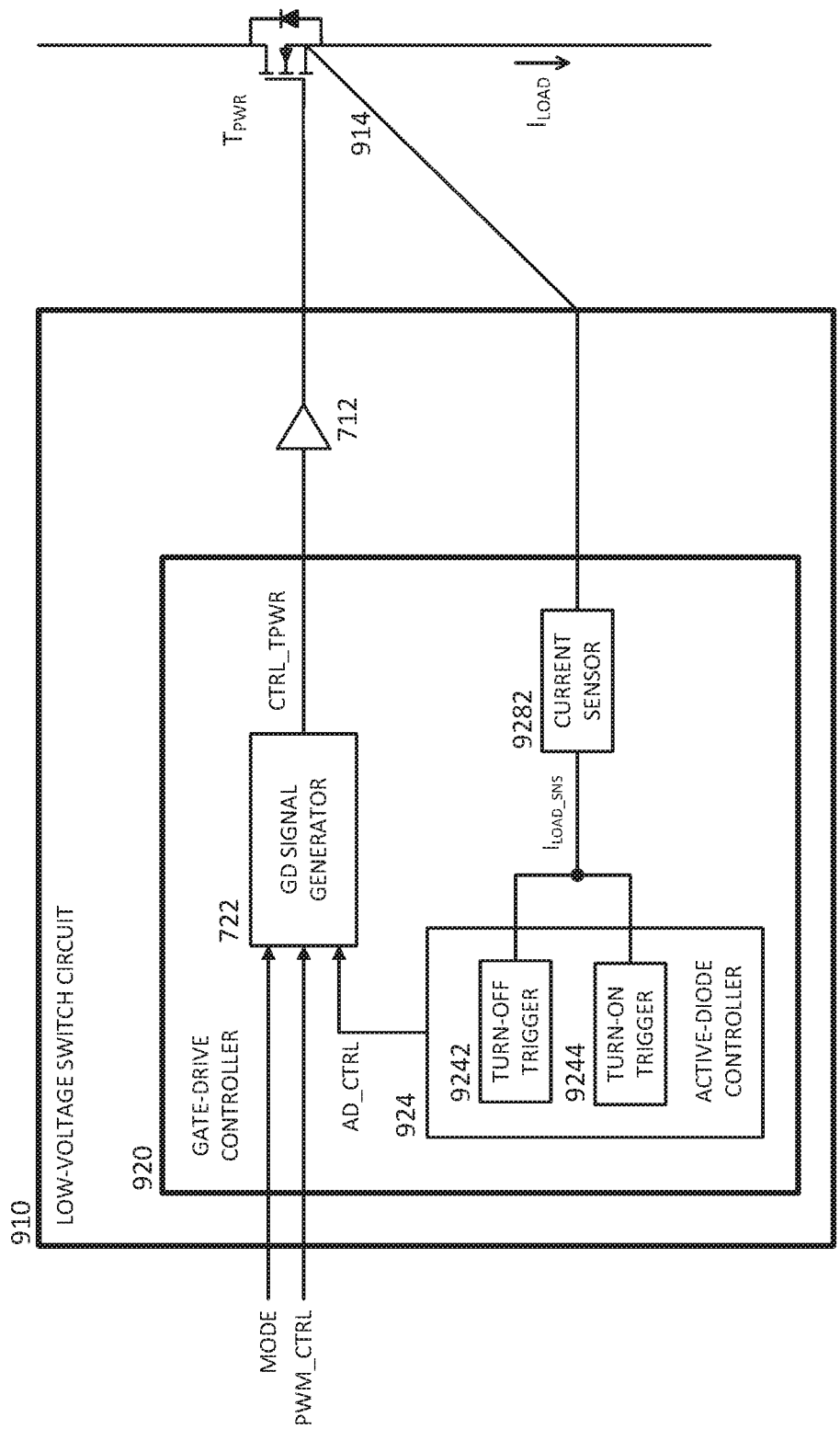
FIG. 9 illustrates a schematic diagram of a switch circuit having a power switch that outputs a current sense signal.

FIG. 9 illustrates another circuit partitioning, in which the power switch $T_{PWR}$ outputs a current sense signal 914. The gate-drive controller 920 and the gate driver 712 may be integrated within a low-voltage switch circuit 910, as described previously. The current sense signal 914 is input to a current sensor 9282 within the gate-drive controller 920. As alluded to in the description of FIG. 6A, the gate-drive controller 920 uses a sensed current $I_{LOAD\_SNS}$ for triggering the turn on and turn off of the power switch $T_{PWR}$. For example, the current sensor 9282 may sense that current is flowing through the body diode and, in response, the turn-on trigger 9244 sets the active-diode control signal (AD_CTRL) to turn on the power switch $T_{PWR}$. Once the magnitude of the current $I_{LOAD\_SNS}$ reaches a threshold, the turn-off trigger 9242 resets the active-diode control signal (AD_CTRL) so as to turn off the power switch $T_{PWR}$.

Motor/Generator Controller

Figure 10A:
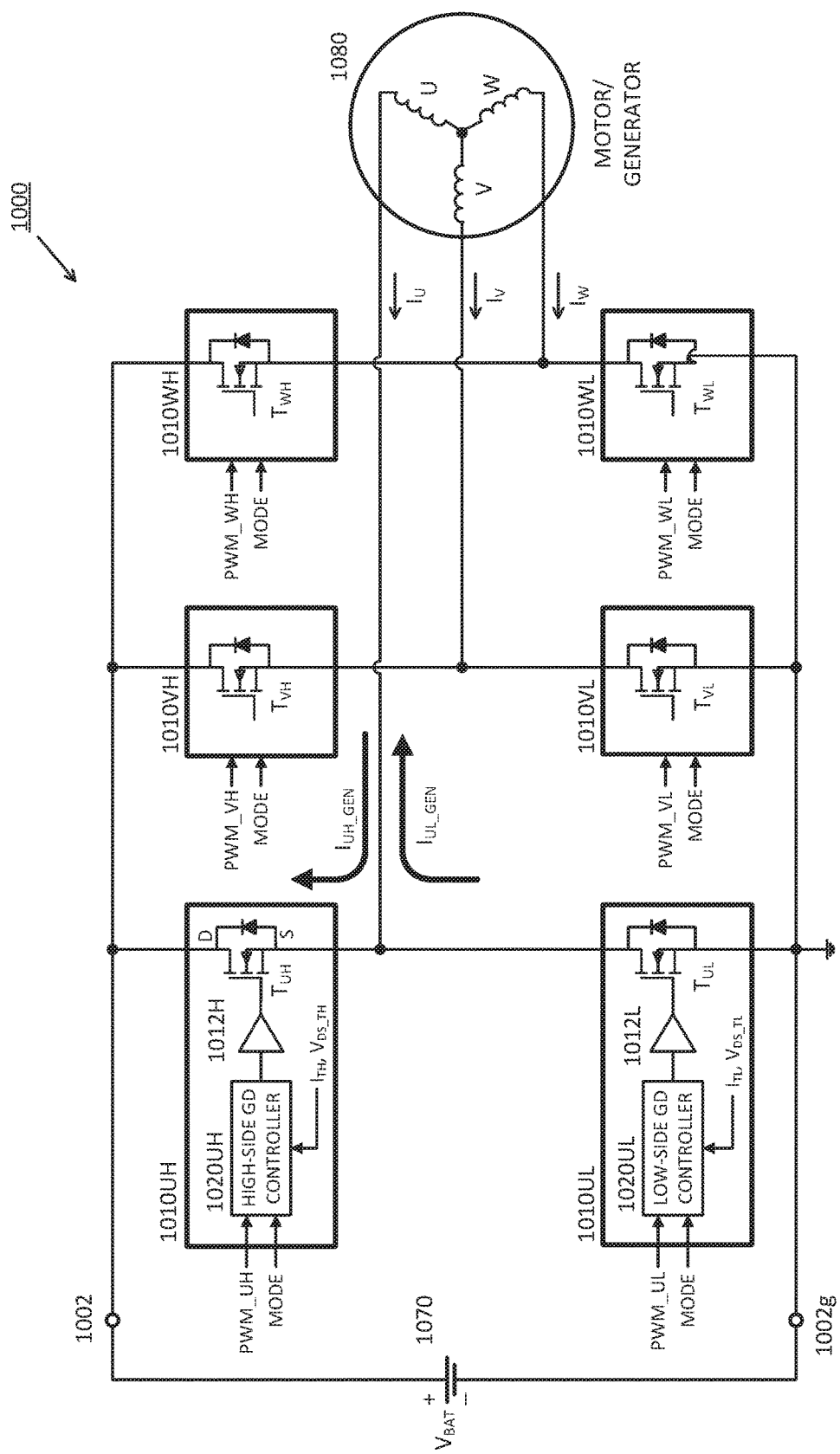
FIG. 10A illustrates a schematic diagram of a driver circuit for a motor/generator, wherein the driver circuit may be operated as a power stage for driving the motor/generator or as an active rectifier for rectifying the power generated by the motor/generator.

FIG. 10A illustrates a bridge circuit 1000 that may be used as a power stage or as an active rectifier for a 3-phase motor/generator 1080. In a first mode, the motor/generator 1080 is operated as a motor and powered from a battery 1070. In a second mode, the motor generator 1080 is operated as a generator and the battery 1070 is charged. The gate-drive controllers 1020UH, 1020UL, 1020VH, 1020VL, 1020WH, 1020WL are configured such that the bridge circuit 1000 may be operated as a power stage for motor mode, or as an active rectifier for generator mode.

The motor/generator 1080 is comprised of 3 phases, denoted 'U,' 'V,' and 'W.' Each of the phases is connected to a half-bridge circuit. A first half-bridge includes switch circuits 1010UH, 1010UL, and source/sinks current for phase U. A second half-bridge includes switch circuits 1010VH, 1010VL, and source/sinks current for phase V. A third half-bridge includes switch circuits 1010WH, 101WL, and source/sinks current for phase W.

The phase-U high-side switch circuit 1010UH is configured similarly to the high-side switch circuit 110H of FIG. 1. More particularly, this circuit 1010UH may be operated in an active-diode mode or in a PWM mode. The phase-U low-side switch circuit 1010UL is configured similarly to the low-side switch circuit 110L of FIG. 1, and may also be operated in an active-diode or in a PWM mode. Phases V and W have similar associated high and low-side switch circuits 1010VH, 1010VL, 1010WH, 1010WL.

When the motor/generator 1080 is operated in motor mode, the MODE signal provided to each of the GD controllers 1020H, 1020L is set to PWM mode. PWM control signals PWM_UH, PWM_UL, PWM_VH, PWM_VL, PWM_WH, PWM_WL are generated with appropriate staggering so as to drive the motor in a desired direction and with a desired speed. A controller, not shown for ease of illustration, generates the PWM control signals and the mode signal. Such motor control and PWM signal generation is well-known in the art, and will not be described further.

When the motor/generator 1080 is operated in generator mode, the MODE signal provided to each of the GD controllers 1020H, 1020L is set to active-diode mode. PWM signals need not be generated. In active-diode mode, the GD controllers 1020H, 1020L operate the switches $T_L$, $T_H$ of each phase as active diodes, wherein current is only allowed to flow in the direction of the body diodes for these switches.

Current flows to the battery 1070, via terminal 1002, so as to charge the battery 1070 in this mode.

Figure 10B:
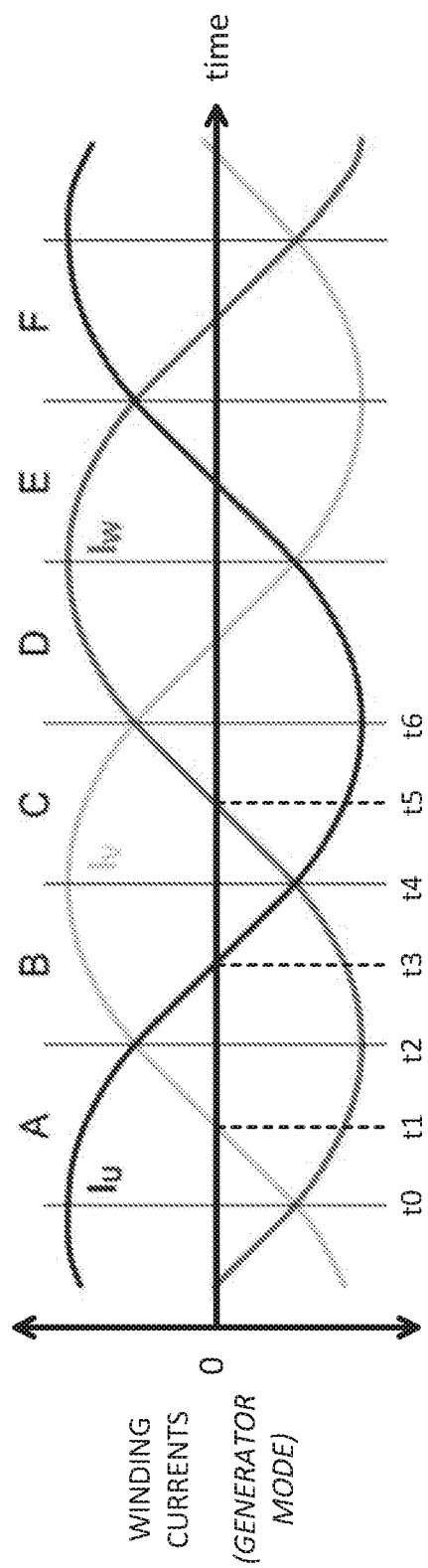
FIG. 10B illustrates waveforms corresponding to currents output from the motor/generator when operated in generator mode.

FIG. 10B illustrates waveforms corresponding to winding currents generated during the generator mode operation. For phase U, the high-side switch $T_{I,IH}$ is turned on until time t3, and current flows as illustrated in the direction of $I_{UH\_GEN}$. At time t3, the high-side switch $T_{I,IH}$ is turned off and the low-side switch $T_{UL}$ is turned on, resulting in the illustrated current flow $I_{UL\_GEN}$. In like manner, the high-side switches of the other phases are turned on when the illustrated currents $I_V$, $I_W$ are positive, and the low-side switches are turned on when these currents are negative. The GD controller configuration allows for the bridge circuit to operate as either a power stage or as an active rectifier. Operation of the bridge circuit as an active rectifier provides better power efficiency than reliance upon the body diode (or other passive diode) rectification, and does not require additional complexity or connections for a controller of the motor/generator 1080.

Bi-Directional On-Board Charger (OBC)

Figure 11:
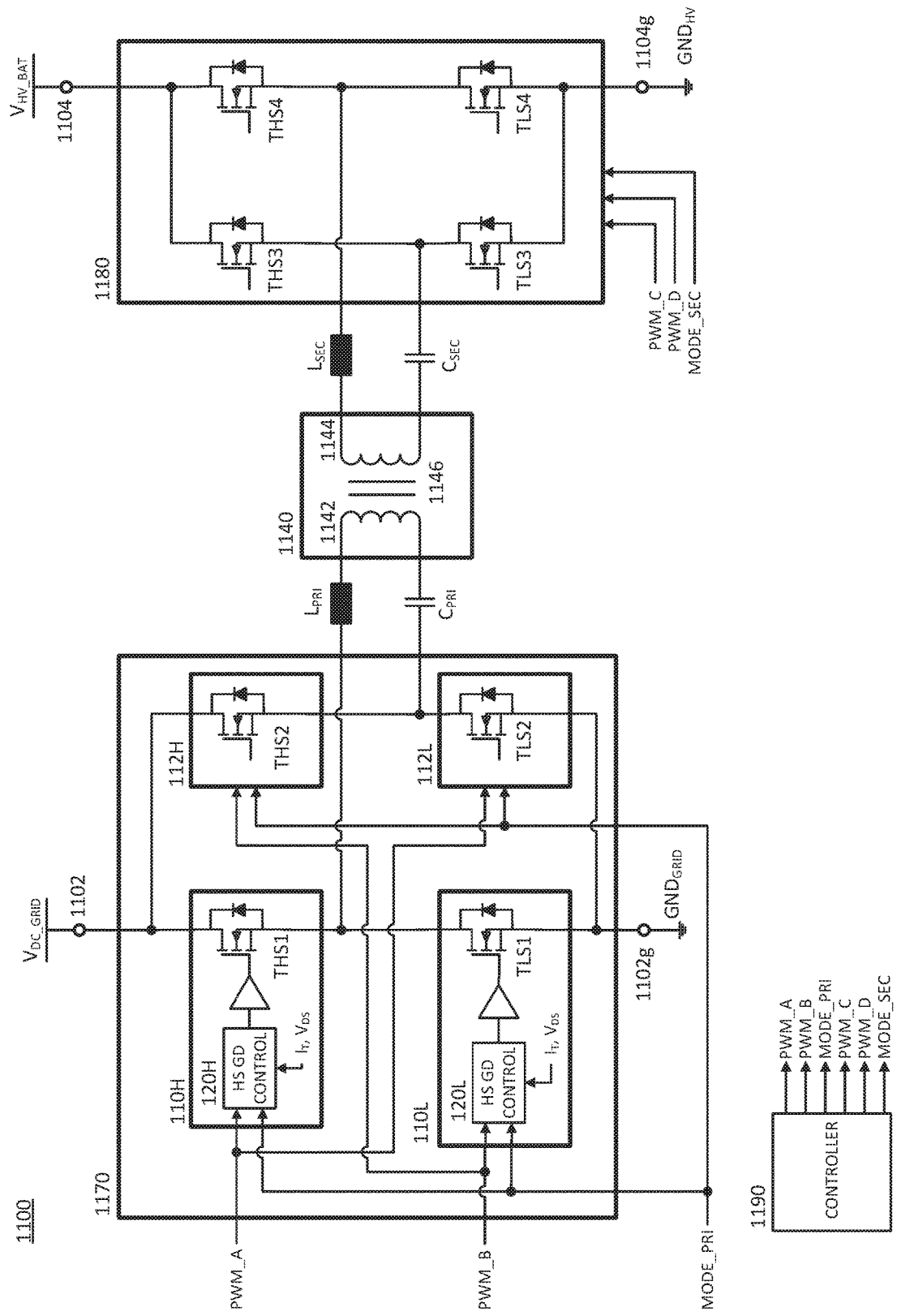
FIG. 11 illustrates an isolated on-board charger that supports power transfer in either direction.

An OBC may comprise an AC/DC converter coupled between the AC grid voltage and an intermediate voltage $V_{DC\_GRID}$, and a DC/DC converter coupled between $V_{DC\_GRID}$ and an output voltage, such as $V_{HV\_BAT}$. FIG. 11 illustrates a DC/DC converter 1100 of an OBC as may be used to charge a high-voltage battery, e.g., in an electric or hybrid vehicle, from an electrical grid. In addition to such charging, the converter 1100 also supports the flow of energy from the battery back to the grid side of the OBC. Such reverse energy flow enables the use of the high-voltage battery for providing AC power to a house if the electrical grid is down, to AC appliances when the grid is not available but the high-voltage battery is (e.g., when camping), etc. Note that the illustrated converter 1100 does not show an AC-to-DC (or DC-to-AC) conversion on the grid side, but many systems would include such converters.

The converter 1100 connects to a primary-side DC supply/sink, having voltage $V_{DC\_GRID}$, using power nodes 1102, 1102g, and connects to a secondary-side DC supply/sink having voltage $V_{HV\_BAT}$, using power nodes 1104, 1104g. AC voltage may be handled by an AC-to-DC converter part of the OBC (not shown for ease of illustration). The converter 1100 further comprises a primary-side power stage 1170, a secondary-side power stage 1180, an isolation transformer 1140, and a controller 1190.

The transformer 1140 includes a primary winding 1142, a secondary winding 1144, and a core 1146. The primary-side power stage 1170 may be coupled to the primary winding 1142 via a primary-side inductor $L_{PRI}$ and a primary-side capacitor $C_{PRI}$, so as to provide an LLC converter topology. Similarly, the secondary-side power stage 1180 may be coupled to the secondary winding 1144 via a secondary-side inductor $L_{SEC}$ and a secondary-side capacitor $C_{SEC}$. In other embodiments, the capacitors $C_{PRI}$, $C_{SEC}$ are omitted, as in a full-bridge converter topology that uses zero-voltage switching (ZVS).

The primary-side power stage 1170 is configured in a full-bridge topology, and may be operated either to supply power to the transformer 1140 or to actively rectify power supplied by the transformer 1140. The power stage 1170 comprises a first high-side switch circuit 110H, a first low-side switch circuit 110L, a second high-side switch circuit 112H, and a second low-side switch circuit 112L. These switch circuits 110H, 110L, 112H, 112L are configured as described for the similar circuits 110H, 110L of FIG. 1, and may further use the specific embodiments described in conjunction with any of FIGS. 6 to 9. Notably, each of the switch circuits 110H, 110L, 112H, 112L includes gate drive controllers, e.g., 120H, 120L. For ease of illustration, the gate drive controllers are not explicitly shown in the switch circuits 112H, 112L or in the secondary-side power stage 1180, but should be understood as being present.

A mode configuration MODE_PRI is provided to the power stage 1170 and determines whether it should operate in a forward or a reverse mode. In the forward mode, the switch circuits 110H, 110L, 112H, 112L are controlled according to switch control signals PWM_A, PWM_B. In a first interval, the signal PWM_A turns on switches THS1, TLS2, via gate-drive controllers 120H, 122L, so as to apply voltage across the primary-side winding 1142. In a second interval, the signal PWM_B turns on switches TLS1, THS2, via gate-drive controllers 120L, 122H, so as to apply voltage, in an opposite polarity, across the primary-side winding 1142. Because such full-bridge operation of an LLC topology is well-known in the art, it will not be described in further detail.

If the mode configuration MODE_PRI indicates operation in the reverse mode, the switches THS1, TLS1, THS2, TLS2 of the switch circuits 110H, 110L, 112H, 112L are operated as active diodes. This operation is autonomous, i.e., no switch control signals, e.g., PWM_A, PWM_B, need to be generated or supplied to the primary-side power stage 1170 in this mode. The power stage 1170 operates, in the reverse mode, as an active rectifier.

The secondary-side power stage 1180 is configured in largely the same manner as the primary-side power stage 1170, and includes power switches THS3, TLS3, THS4, TLS4. Each of these power switches has an associated gate-drive controller and gate driver. For ease of illustration, these components are not explicitly shown, but should be understood to be configured as described above for the like components of the primary-side power stage 1170. Switch control signals PWM_C, PWM_D control the power switches THS3, TLS3, THS4, TLS4 when the configuration signal MODE_SEC indicates reverse mode, whereas the power switch circuits are operated as active diodes when the configuration signal MODE_SEC indicates forward mode.

The controller 1190 generates the switch control signals PWM_A, PWM_B, PWM_C, PWM_D and configuration signals MODE_PRI, MODE_SEC. The controller 1190 may be located on the primary or secondary side of the OBC 1100. In typical implementations, at least some of the generated signals will need to pass through isolators to maintain the integrity of the isolation barrier established by the transformer 1140. For ease of illustration and because such isolators are well-known, such isolators are not explicitly shown.

While the converter 1100 of FIG. 11 is described using the specific example of full-bridge power stages arranged in an isolated LLC topology, it should be understood that other embodiments may use other power stage topologies, such as switches arranged in a half bridge. Furthermore, the switches may be controlled using phase-shift control, in which a phase shift between control signals is used to determine the amount of power transfer, rather than PWM control, in which a duty cycle or frequency of the PWM signals is used to determine the amount of power transfer.

Method for Controlling SR Switch

Figure 12:
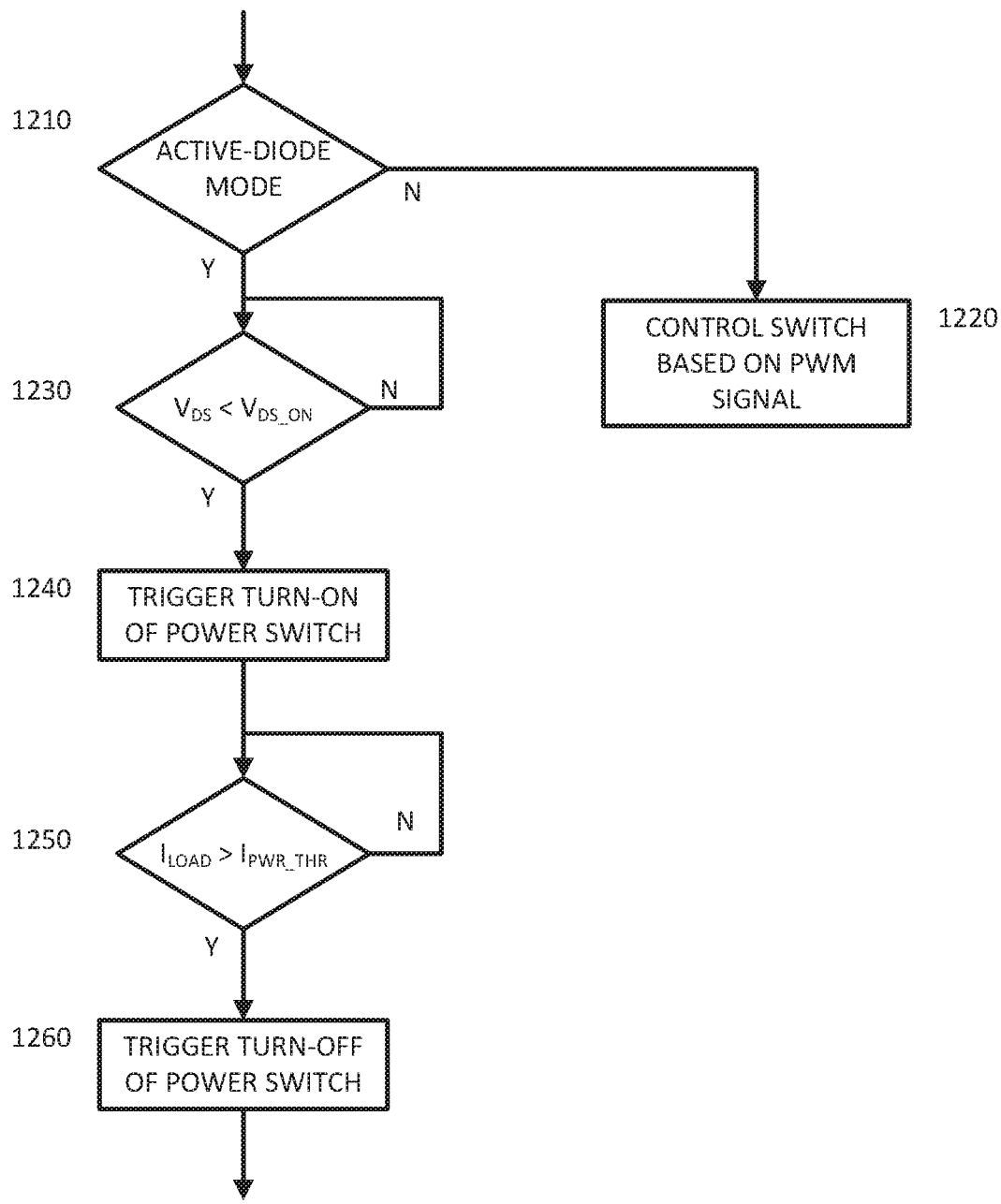
FIG. 12 illustrates a method for controlling a power switch in either an active-diode or a PWM mode.

FIG. 12 illustrates a method 1200 for controlling a power switch. This method may be implemented in a gate-drive controller as illustrated, e.g., in FIGS. 1, and 6 to 9. The method begins by determining 1210 whether a received configuration signal indicates whether the power switch is to be operated in an active-diode or a normal (e.g., PWM)

mode. If the normal mode is indicated, the power switch is controlled (turned on and off) 1220 according to a received PWM control signal. If the active-diode mode is indicated, a drain-to-source voltage $V_{DS}$ of the power switch is sensed and compared against a voltage threshold $V_{DS\_ON}$. If the drain-to-source voltage is sufficiently negative, e.g., below a voltage threshold $V_{DS\_ON}$ such as −0.1V, the power switch is turned on 1240. (Stated alternatively, a source-to-drain voltage above a threshold such as 0.1V triggers the turn on of the power switch.) Similarly and/or alternatively, a positive current through the power switch in the direction of the body diode can trigger the turn on of the power switch. Once the power switch is turned on, forward current $I_{LOAD}$, which is negative, through the switch is monitored. Once it is detected 1250 that this (negative) current $I_{LOAD}$ rises above a threshold $I_{PWR\_THR}$, the power switch is turned off 1260.

Embodiment Variations

According to an embodiment, a method is provided for controlling a power switch having an intrinsic diode configured to conduct current in a reverse direction of the power switch. The method comprises receiving a configuration signal indicating an operational mode for the power switch. If a first mode, which indicates an active-diode configuration, is received, a current and/or voltage of the power switch is sensed and the power switch is turned on if the sensed current and/or voltage indicates positive current, or the potential for positive current, in the reverse direction through the power switch. If a second mode, which indicates a normal (PWM) configuration, is received, the power switch is turned off responsive to receiving a switch control signal directing that the power switch be turned off, and is turned on responsive to receiving a switch control signal directing that the power switch be turned on.

According to any embodiment of the method, the method further includes, responsive to the configuration signal indicating a protected mode, sensing a current and/or voltage of the power switch. The power switch is turned off responsive to at least one of detecting that the sensed current is outside of a normal operating current range, detecting that the sensed voltage is outside of a normal operating voltage range, and receiving a switch control signal directing that the power switch be turned off. The power switch is turned on responsive to receiving a switch control signal directing that the power switch be turned on.

According to any embodiment of the method, sensing the current comprises measuring a voltage across first and second terminals of the power switch and determining the current based upon the voltage. According to an embodiment of this method, responsive to the configuration indicating the first mode (active-diode configuration), turning on the power switch comprises changing a control signal to turn on the power switch in response to detecting that the voltage across the first and second terminals is below a first voltage threshold, which is negative. Subsequently and responsive to detecting that the voltage across the first and second terminals is above a second threshold, the control signal is changed so as to turn off the power switch.

According to an embodiment of a bi-directional switched mode power supply (SMPS), the SMPS comprises first and second SMPS terminals for providing external connections to the SMPS, high and low-side switches, an inductor, a controller, and first and second driver circuits. The high and low-side switches are coupled together at a switching node. The high-side switch is additionally coupled to the first SMPS terminal. Each of the switches comprises an intrinsic diode configured to conduct current in a reverse direction of the switch. The inductor is electrically interposed between the switching node and the second SMPS terminal. The controller is configured to control the power flow between the first and the second SMPS terminals by generating a switch control signal for at least one of the high-side and the low-side switches. The first driver control circuit is configured to control conductivity of the high-side switch based on a sensed current and/or voltage at the high-side switch, responsive to reception of a first switching mode indication (an active-diode mode). The first driver control circuit is configured to control the conductivity of the high-side switch based on the switch control signal generated by the controller, responsive to reception of a second switching mode indication, e.g., a normal or PWM mode. The second driver control circuit is similarly configured to control conductivity of the low-side switch based on a sensed current and/or voltage at the low-side switch, responsive to reception of a first switching mode indication (e.g., an active-diode mode). The second driver control circuit is configured to control conductivity of the low-side switch based on the switch control signal generated by the controller, responsive to reception of the second switching mode indication, e.g., a normal or PWM mode. The SMPS is configured to operate, during a first interval, in a first mode in which power is transferred from the first to the second SMPS terminal, and, during a second interval, in a second mode in which power is transferred from the second to the first SMPS terminal.

According to any embodiment of the SMPS, the first mode is a buck mode, the first SMPS terminal is coupled to a power source, the second SMPS terminal is coupled to a power sink, and a source voltage at the first SMPS terminal is stepped down to provide a sink voltage at the second SMPS terminal, the sink voltage being lower than the source voltage. In a further embodiment of this SMPS, the controller is configured to transmit the first switching mode indication to the second driver control circuit so as to operate the low-side switch in an active-diode configuration, when the SMPS operates in the buck mode.

According to any embodiment of the SMPS, the second mode is a boost mode, the second SMPS terminal is coupled to a power source, the first SMPS terminal is coupled to a power sink, and a source voltage at the second SMPS terminal is stepped up to provide a sink voltage at the first SMPS terminal. The sink voltage is higher than the source voltage. In another embodiment of this SMPS, the controller is configured to transmit the first switching mode indication to the first driver control circuit, so as to set the high-side switch to an active-diode configuration, when the SMPS operates in the boost mode.

According to any embodiment of the SMPS, the SMPS further includes first and second protection switches interposed between the switching node and the second terminal, each of the protection switches comprising intrinsic diodes that are not capable of blocking current in one direction, wherein the protection switches are serially connected such that their intrinsic diodes are oriented in opposite directions. According to a further embodiment of this SMPS, during the first mode, the SMPS operates in a buck mode in which positive current flows to the second SMPS terminal, the first protection switch is set to conduct, and the second protection switch is operated in a first mode (active-diode configuration) in which the second protection switch is turned on responsive to detecting that positive current flows in the direction from the switching node to the second SMPS terminal. According to another embodiment of this SMPS, during the second mode, the SMPS operates in a boost mode in which positive current flows from the second SMPS terminal to the switching node, the second protection switch is set to conduct, and the first protection switch is operated in the first mode (active-diode configuration) in which the first protection switch is turned on responsive to detecting that positive current flows in the direction from the second SMPS terminal to the switching node.

According to an embodiment of a DC/DC converter, the converter comprises first and second direct-current (DC) power nodes, each of which is for connecting to a power source or sink, an isolation transformer comprising primary and secondary windings, a primary-side power stage, a secondary-side power stage and a controller. The primary-side power stage couples the first DC power node to the primary winding. The secondary-side power stage couples the secondary winding to the second DC power node. The secondary-side power stage comprises a secondary-side half bridge including first and second secondary-side power switches arranged in a half-bridge configuration. The secondary-side power stage further comprises first and second secondary-side switch controller circuits coupled, respectively, to the first and second secondary-side power switches. Each of the switch controller circuits is configured for operation in a second (normal) mode, in which an externally-provided switch control signal controls conductivity of the power switch coupled to the switch controller circuit, and a first (active-diode) mode, in which conductivity of the power switch coupled to the switch controller is based upon a sensed current and/or voltage of the power switch. The controller is configured to operate the DC/DC converter, during a first interval, in a forward mode in which power is transferred from the first to the second DC power node, and, during a second interval, in a reverse mode in which power is transferred from the second to the first power node. For the forward mode, the controller sets the secondary-side controller circuits to operate the secondary-side power switches in the active-diode mode. For the reverse mode, the controller sets the secondary-side controller circuits to operate the secondary-side power switches in the normal mode, and generates the externally-provided control signals for the secondary-side power switches.

According to any embodiment of the DC/DC converter, the secondary-side power stage further comprises a second secondary-side half bridge that includes third and fourth secondary-side power switches arranged in a half-bridge configuration, third and fourth secondary-side switch controller circuits configured to operate, respectively, the third and fourth secondary-side power switches in the normal mode or in the active-diode mode, according to a mode setting provided by the controller, and a secondary-side inductor coupled to the secondary winding.

According to any embodiment of the DC/DC converter, the primary-side power stage comprises a primary-side full bridge comprising four primary-side switches, and four primary-side switch controller circuits configured to operate each of the primary-side switches in the normal mode or in the active-diode mode, according to a setting provided by the controller.

According to any embodiment of the DC/DC converter, the converter further comprises a battery coupled to the second DC power node. According to a further embodiment, during the forward mode, the battery is charged from a power source coupled to the first DC power node. According to another embodiment, during the reverse mode, the battery supplies power to a power sink coupled to the first DC power node.

As used herein, the terms "having," "containing," "including," "comprising," and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for controlling a power switch having an intrinsic diode configured to conduct current in a reverse direction of the power switch, the method comprising:
    responsive to a configuration signal indicating a first mode for the power switch:
        sensing a current and/or voltage at the power switch; and
        turning on the power switch responsive to the sensed current and/or voltage indicating a current and/or a potential for current in the reverse direction; and
    responsive to the configuration signal indicating a second mode for the power switch:
        turning off the power switch responsive to receiving a switch control signal directing that the power switch be turned off; and
        turning on the power switch responsive to receiving a switch control signal directing that the power switch be turned on.

2. The method of claim 1, further comprising:
    responsive to the configuration signal indicating a protected mode:
        sensing the current and/or voltage at the power switch; and
        turning off the power switch responsive to at least one of detecting that the sensed current is outside of a normal operating current range, detecting that the sensed voltage is outside of a normal operating voltage range, and receiving a switch control signal directing that the power switch be turned off; and
        turning on the power switch responsive to receiving a switch control signal directing that the power switch be turned on.

3. The method of claim 1, wherein sensing the current comprises measuring a voltage across a first terminal and a second terminal of the power switch and determining the current based on the voltage measured across the first terminal and the second terminal.

4. The method of claim 3, wherein, responsive to the configuration indicating the first mode, turning on the power switch comprises:
    responsive to detecting that the voltage measured across the first terminal and the second terminal is below a first voltage threshold, which is negative, changing a control signal to turn on the power switch;
    subsequently and responsive to detecting that the voltage measured across the first terminal and the second terminal is above a second voltage threshold, changing the control signal to turn off the power switch.

5. A bi-directional switched mode power supply (SMPS) comprising:
- a first terminal and a second terminal providing external connections for the SMPS;
- a high-side switch and a low-side switch coupled together at a switching node, the high-side switch coupled to the first terminal, each of the high-side switch and the low-side switch comprising an intrinsic diode configured to conduct current in a reverse direction of the high-side switch and the low-side switch;
- an inductor electrically interposed between the switching node and the second terminal;
- a controller configured to generate a switch control signal for controlling a switching of the high-side switch and/or the low-side switch;
- a first driver control circuit configured to control a conductivity of the high-side switch based on a sensed current and/or voltage at the high-side switch responsive to receiving a first switching mode indication, and to control the conductivity of the high-side switch based on the switch control signal generated by the controller responsive to receiving a second switching mode indication; and
- a second driver control circuit configured to control a conductivity of the low-side switch based on a sensed current and/or voltage at the low-side switch responsive to receiving the first switching mode indication, and to control the conductivity of the low-side switch based on the switch control signal generated by the controller responsive to receiving the second switching mode indication,
- wherein the SMPS is configured to operate, during a first interval, in a first mode, in which power is transferred from the first terminal to the second terminal, and, during a second interval, in a second mode, in which power is transferred from the second terminal to the first terminal.

6. The SMPS of claim 5, wherein the first mode is a buck mode, the first terminal is coupled to a power source, the second terminal is coupled to a power sink, and the SMPS is configured to step down a source voltage at the first terminal to provide a sink voltage at the second terminal, the sink voltage being lower than the source voltage.

7. The SMPS of claim 6, wherein the controller is configured to transmit the first switching mode indication to the second driver control circuit when the SMPS operates in the buck mode.

8. The SMPS of claim 5, wherein the second mode is a boost mode, the second terminal is coupled to a power source, the first terminal is coupled to a power sink, and the SMPS is configured to step up a source voltage at the second terminal to provide a sink voltage at the first terminal, the sink voltage being higher than the source voltage.

9. The SMPS of claim 8, wherein the controller is configured to transmit the first switching mode indication to the first driver control circuit when the SMPS operates in the boost mode.

10. The SMPS of claim 5, further comprising a first protection switch and a second protection switch interposed between the switching node and the second terminal, each of the first protection switch and the second protection switch comprising an intrinsic diode that is not capable of blocking current in one direction, wherein the first protection switch and the second protection switch are serially connected such that their intrinsic diodes are oriented in opposite directions.

11. The SMPS of claim 10, wherein, during the first mode, the SMPS is configured to operate in a buck mode, in which positive current flows to the second terminal, the first protection switch is set to conduct, and the second protection switch is operated in a first switching mode, in which the second protection switch is turned on responsive to detecting that positive current flows in the direction from the switching node to the second terminal.

12. The SMPS of claim 10, wherein, during the second mode, the SMPS is configured to operate in a boost mode, in which positive current flows from the second terminal to the switching node, the second protection switch is set to conduct, and the first protection switch is operated in a first switching mode, in which the first protection switch is turned on responsive to detecting that positive current flows in the direction from the second terminal to the switching node.

13. A bi-directional DC/DC converter comprising:
- a first direct-current (DC) power node for connecting to a first power source or sink;
- a second DC power node for connecting to a second power source or sink;
- an isolation transformer comprising a primary winding and a secondary winding;
- a primary-side power stage configured to couple the first DC power node to the primary winding;
- a secondary-side power stage configured to couple the secondary winding to the second DC power node and comprising:
  - a secondary-side half bridge including first and second secondary-side power switches arranged in a half-bridge configuration; and
  - first and second secondary-side switch controller circuits coupled, respectively, to the first and second secondary-side power switches, each of the first and second secondary-side switch controller circuits configured for operation in a first mode, in which a conductivity of the respective one of the first and second secondary-side power switches coupled to the respective one of the first and second secondary-side switch controllers is based on a sensed current and/or voltage at the respective power switch, and in a second mode, in which an externally-provided switch control signal controls the conductivity of the respective one of the first and second secondary-side power switches coupled to the respective one of the first and second secondary-side switch controller circuits;
- a controller configured to operate the bi-directional DC/DC converter, during a first interval, in a forward mode, in which power is transferred from the first DC power node to the second DC power node, and, during a second interval, in a reverse mode, in which power is transferred from the second DC power node to the first DC power node;
- wherein, for the forward mode, the controller is configured to set the first and second secondary-side controller circuits to operate the first and second secondary-side power switches in the first mode, and
- wherein, for the reverse mode, the controller is configured to generate the externally-provided control signal for the first and second secondary-side power switches.

14. The bi-directional DC/DC converter of claim 13, wherein the secondary-side power stage further comprises:
- a second secondary-side half bridge including third and fourth secondary-side power switches arranged in a half-bridge configuration;
- third and fourth secondary-side switch controller circuits coupled, respectively, to the third and fourth secondary-side power switches and configured for operation in the first mode and in the second mode, according to a mode setting provided by the controller; and a secondary-side inductor coupled to the secondary winding.

15. The bi-directional DC/DC converter of claim 13, wherein the primary-side power stage comprises:

a primary-side full bridge comprising first, second, third, and fourth primary-side switches; and first, second, third, and fourth primary-side switch controller circuits configured to operate each of the respective first, second, third, and fourth primary-side switches in the first mode or the second mode, according to a mode setting provided by the controller.

16. The bi-directional DC/DC converter of claim 13, further comprising a battery coupled to the second DC power node.

17. The bi-directional DC/DC converter of claim 16, wherein, during the forward mode, the battery is charged from a power source coupled to the first DC power node.

18. The bi-directional DC/DC converter of claim 16, wherein, during the reverse mode, the battery supplies power to a power sink coupled to the first DC power node.

\* \* \* \* \*